(12) United States Patent
Matsuhashi et al.

(10) Patent No.: US 10,109,568 B2
(45) Date of Patent: Oct. 23, 2018

(54) SEMICONDUCTOR DEVICE MANUFACTURING METHOD AND SEMICONDUCTOR DEVICE

(71) Applicant: Renesas Electronics Corporation, Koutou-ku, Tokyo (JP)

(72) Inventors: Jun Matsuhashi, Gunma (JP); Naohiro Makihira, Gunma (JP); Hidekazu Iwasaki, Gunma (JP); Toshitsugu Ishii, Gunma (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 14 days.

(21) Appl. No.: 15/674,491

(22) Filed: Aug. 10, 2017

(65) Prior Publication Data

US 2018/0102310 A1    Apr. 12, 2018

(30) Foreign Application Priority Data

Oct. 7, 2016    (JP) .................................. 2016-198908

(51) Int. Cl.
| | |
|---|---|
| H01L 23/00 | (2006.01) |
| H01L 23/498 | (2006.01) |
| H01L 21/56 | (2006.01) |
| H01L 21/78 | (2006.01) |
| H01L 21/66 | (2006.01) |

(52) U.S. Cl.
CPC ...... *H01L 23/49816* (2013.01); *H01L 21/563* (2013.01); *H01L 21/78* (2013.01); *H01L 22/34* (2013.01); *H01L 23/49838* (2013.01); *H01L 24/06* (2013.01); *H01L 24/45* (2013.01); *H01L 24/46* (2013.01); *H01L 2224/04042* (2013.01); *H01L 2224/45644* (2013.01)

(58) Field of Classification Search
None
See application file for complete search history.

(56) References Cited

U.S. PATENT DOCUMENTS

| | | | | |
|---|---|---|---|---|
| 5,730,606 | A | * | 3/1998 | Sinclair .................. H01R 13/04 439/70 |
| 6,261,114 | B1 | * | 7/2001 | Shimada .............. H05K 7/1084 439/266 |

FOREIGN PATENT DOCUMENTS

| | | |
|---|---|---|
| JP | H09-219267 A | 8/1997 |
| JP | 2000-315555 A | 11/2000 |

* cited by examiner

*Primary Examiner* — William Harriston
(74) *Attorney, Agent, or Firm* — Shapiro, Gabor and Rosenberger, PLLC

(57) ABSTRACT

The present invention is directed to improve reliability of a semiconductor device. A semiconductor device manufacturing method includes: (a) a step of attaching a BGA having a solder ball to a socket for a burn-in test; and (b) a step of performing a burn-in test of the BGA by sandwiching the solder ball by conductive contact pins in the socket. The contact pin in the socket has a first projection part which is conductive and extends along an attachment direction of the BGA and a second projection part which is conductive, provided along a direction crossing the extension direction of the first projection part, and placed so as to face the surface on the attachment side of the BGA of the solder ball. In the step (b), a burn-in test of the BGA is performed in a state where the first projection parts in the contact pins are in contact with the solder ball.

16 Claims, 20 Drawing Sheets

SEMICONDUCTOR DEVICE MANUFACTURING METHOD AND SEMICONDUCTOR DEVICE

CROSS-REFERENCE TO RELATED APPLICATIONS

The disclosure of Japanese Patent Application No. 2016-198908 filed on Oct. 7, 2016 including the specification, drawings and abstract is incorporated herein by reference in its entirety.

BACKGROUND

The present invention relates to a semiconductor device and a method of manufacturing the same and relates to, for example, a semiconductor device manufacturing method executing a burn-in test and a semiconductor device.

In a burn-in test process of a semiconductor device, a semiconductor device is attached to each of a plurality of IC sockets (hereinlater, also simply called sockets) provided for a burn-in board, and a burn-in test is performed.

For example, in a semiconductor device of a BGA (Ball Grid Array) type, since an external terminal is a ball electrode, a socket of a sandwich type for a BGA, which achieves electric conductivity by sandwiching a ball electrode by contact pins is known. By using the socket of the sandwich type for a BGA, a burn-in test is performed.

The structure of a socket for a semiconductor package is disclosed in, for example, Japanese Unexamined Patent Application Publication No. 2000-315555 (patent literature 1).

The structure of a contact/socket for a BGA/IC test is disclosed in, for example, Japanese Unexamined Patent Application Publication No. Hei 9(1997)-219267 (patent literature 2).

SUMMARY

As sockets of the sandwich type for a BGA, according to the shapes of the tips of the contact pins in sockets, a horizontal-rib type (the patent literature 1: Japanese Unexamined Patent Application Publication No. 2000-315555) and a vertical-rib type (the patent literature 2: Japanese Unexamined Patent Application Publication No. Hei 9(1997)-219267) are known.

In the case of the horizontal-rib type, when a ball electrode moves upward due to a warp of a substrate of a BGA during a burn-in test or the like, the horizontal rib comes into contact with the ball electrode. It reduces flexibility in the vertical directions of the ball electrode. As a result, expansion and contraction of the substrate of the BGA is disturbed at the time of a burn-in test, and coplanarity of the BGA decreases due to the residual stress.

On the other hand, in the case of the vertical-rib type, since the holding power of the ball electrode by the vertical rib is weak, due to expansion and contraction of the substrate of the BGA at the time of a burn-in test, a pop-up (lift of the BGA) phenomenon occurs, and it causes poor contact of the BGA.

The other problems and novel features will become apparent from the description of the specification and appended drawings.

A semiconductor device manufacturing method according to an embodiment includes the steps of:
(a) attaching a semiconductor device having a ball electrode as an external terminal to a socket for a burn-in test; and
(b) performing a burn-in test of the semiconductor device by sandwiching the ball electrode by a conductive contact part of the socket. Further, the contact part of the socket has a first projection part which is conductive and extends along an attachment direction of the semiconductor device and a second projection part which is conductive and provided along a direction crossing an extension direction of the first extension part and arranged so as to face the surface on the attachment side of the semiconductor device of the ball electrode. In the step (b), the burn-in test of the semiconductor device is performed in a state where the first projection part of the contact part is in contact with the ball electrode.

A semiconductor device according to an embodiment includes: a semiconductor chip; a substrate having a first face over which the semiconductor chip is mounted and a second face positioned on the side opposite to the first face; and a plurality of ball electrodes provided over the second face of the substrate. Further, a first impression extending in the thickness direction of the substrate and a second impression extending in a direction crossing the extension direction of the first impression are formed in a surface of any of the plurality of ball electrodes, and the second impression is formed in the surface on the substrate side of the ball electrode.

According to the embodiment, the reliability of a semiconductor device can be improved.

DETAILED DESCRIPTION

Figure 1:
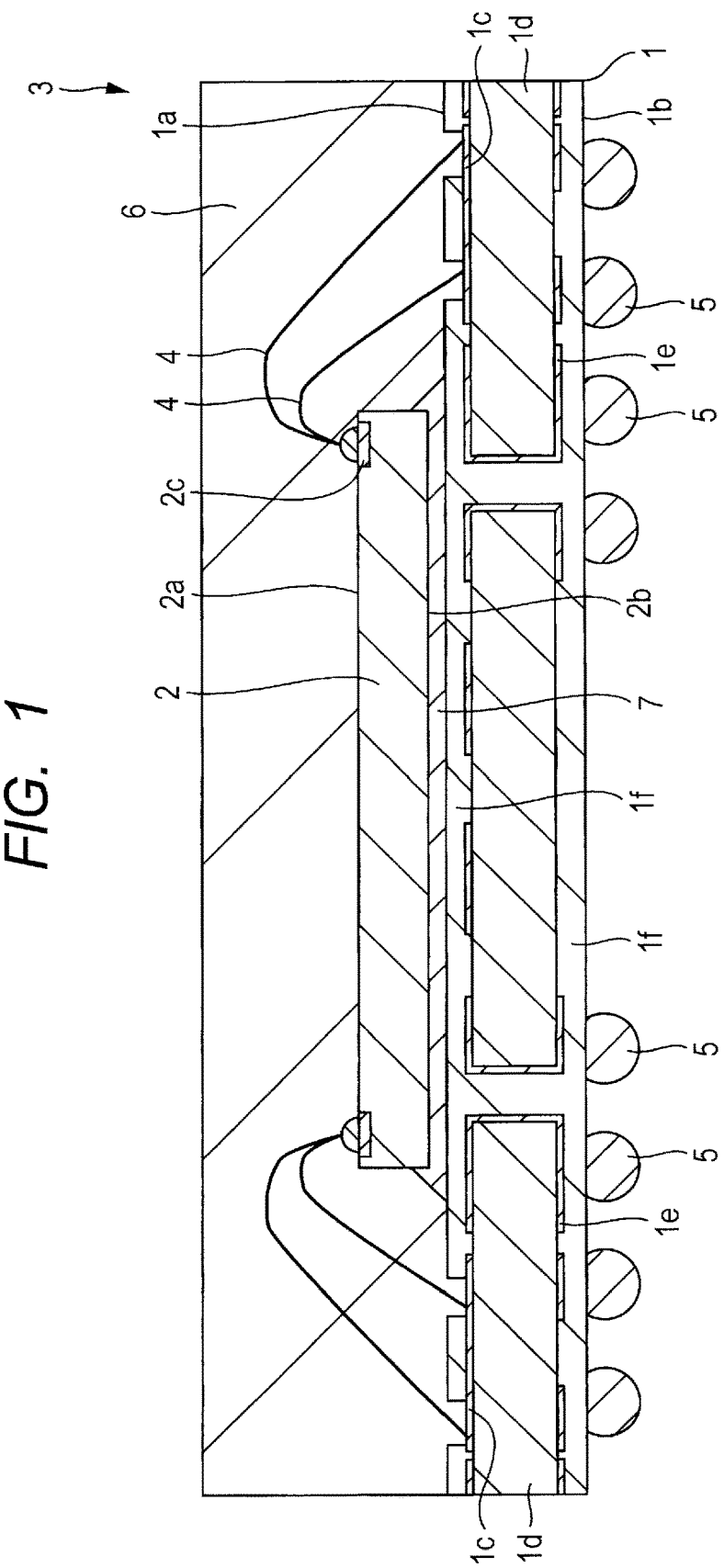
FIG. 1 is a cross section illustrating an example of the structure of a semiconductor device of an embodiment.

In the following embodiments, unless otherwise necessary, description of the same or similar parts will not be repeated as a rule.

Further, in the following embodiments, when it is necessary for convenience, an element will be described by being divided to a plurality of sections or examples. Unless otherwise clearly specified, they are not non-related but have relations such as modification, detailed description, and supplementary explanation in which one is apart or entire of the other.

In the following embodiments, in the case of mentioning the number of elements and the like (including the number of pieces, numerical value, quantity, and range), except for the case where it is clearly mentioned, the case where the invention is principally clearly limited to a specific value, and the like, the invention is not limited to the specific value. The number may be larger or smaller than the specific value.

In the following embodiments, obviously, components (including element steps) are not always necessary except for the case where it is clearly mentioned, the case where it is considered that a component is principally clearly necessary, and the like.

In the following embodiments, when shape, position relation, and the like of components are mentioned, they substantially include shapes and the like close or similar to them except for the case where it is clearly mentioned, the case where it is considered that the shape and the like are not principally clearly similar, and the like. This is similarly applied also to the numerical value and range.

Hereinafter, embodiments will be described in detail with reference to the drawings. In all of the drawings for explaining the embodiments, the same reference numerals are designated to members having the same function and repetitive description will not be given. In some cases, hatching is added even in plan views so that the drawings are easily understood.

Configuration of Semiconductor Device

Figure 2:
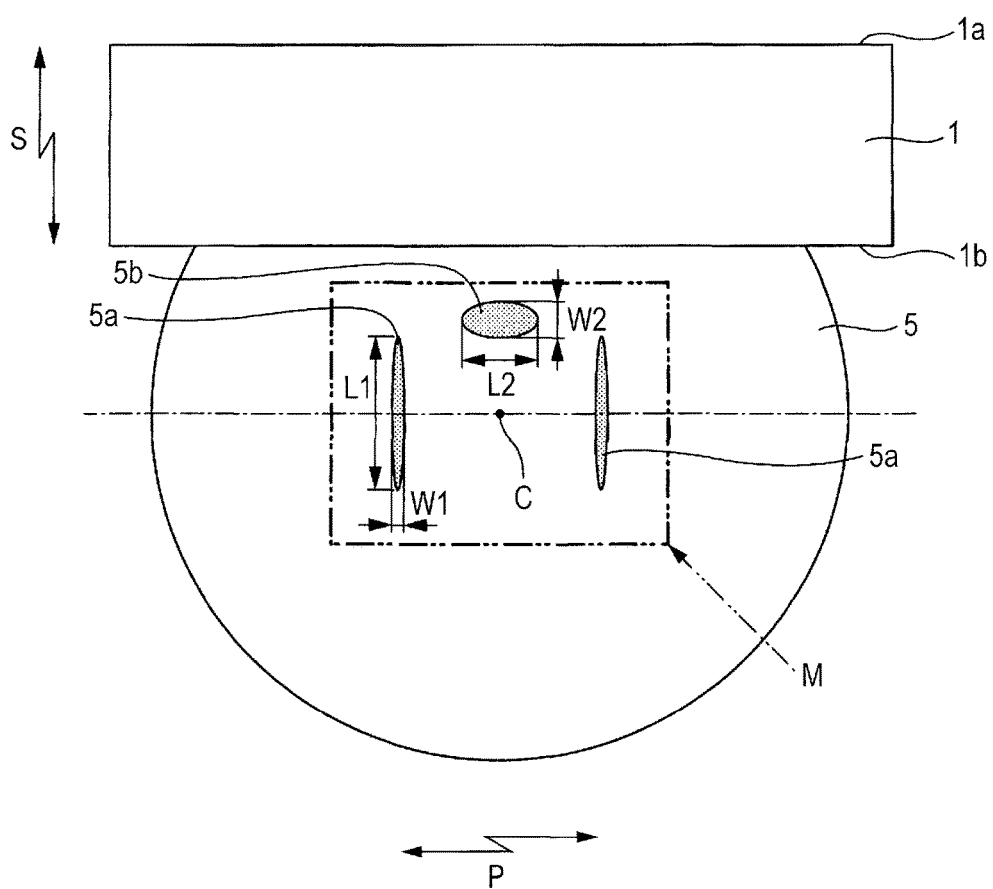
FIG. 2 is a partial side view illustrating an example of impressions in a ball electrode in the semiconductor device depicted in FIG. 1.

FIG. 1 is a cross section illustrating an example of the structure of a semiconductor device of an embodiment, and FIG. 2 is a partial side view illustrating an example of impressions in a ball electrode of the semiconductor device depicted in FIG. 1.

A semiconductor device of the embodiment illustrated in FIG. 1 is a semiconductor device (semiconductor package) in which a semiconductor chip 2 is mounted (joined, coupled, or provided) over a wiring substrate 1, and the semiconductor chip 2 is sealed by a sealing resin.

In the embodiment, as an example of the semiconductor device, the case where a plurality of external terminals provided on the under face side of the wiring substrate 1 are solder balls (ball electrodes) 5 will be described. That is, the semiconductor device of the embodiment is a BGA (Ball Grid Array) 3.

The configuration of the BGA 3 will be described. The BGA 3 has the semiconductor chip 2, the wiring substrate 1 supporting or mounting the semiconductor chip 2, and a plurality of bonding wires (hereinbelow, also simply called wires) 4 electrically coupling a plurality of electrode pads (bonding pads, electrodes) 2c exposed in a main face (surface) 2a of the semiconductor chip 2 and a plurality of bonding leads (coupling terminals) 1c of the wiring substrate 1 corresponding to the electrode pads 2c.

Further, the BGA 3 has a sealing part 6 covering a top face (first face, chip supporting face) 1a of the wiring substrate 1 including the semiconductor chip 2 and the wires 4 and the plurality of solder balls 5 provided in area array arrangement (lattice arrangement) as external terminals on an under face (second face, mounting face) 1b positioned on the side opposite to the top face 1a of the wiring substrate 1.

The shape of the plane of the semiconductor chip 2 crossing the thickness is a square or rectangular shape. For example, various semiconductor elements or semiconductor integrated circuits are formed in the main face of a semiconductor substrate (semiconductor wafer) made of single-crystal silicon or the like and, after that, the semiconductor substrate is divided into semiconductor chips 2 by dicing or the like.

The semiconductor chip 2 has the main face (face on the side of formation of a semiconductor element, surface, top face) 2a and a rear face (the face on the side opposite to the face on the side of formation of a semiconductor element, mounting face, or under face) 2b which are opposed to each other, and is mounted (placed) over the top face 1a of the wiring substrate 1 so that the main face 2a faces upward. The rear face 2b of the semiconductor chip 2 is bonded and fixed to the top face 1a of the wiring substrate 1 via an adhesive (die bonding material, jointing material) 7. Further, the semiconductor chip 2 has a plurality of electrode pads 2c exposed on the side of the main face 2a, and the electrode pads 2c are electrically coupled to semiconductor elements or semiconductor integrated circuits formed on the inside or in a surface layer part of the semiconductor chip 2.

As the adhesive 7 for fixing the semiconductor chip 2, for example, an insulating or conductive paste material, a film-shaped adhesive (die-bonding film, die-attach film), or the like can be used.

The wiring substrate (substrate) 1 has the top face (first face) 1a as one of the main faces and the under face (second face) 1b as the face on the side opposite to the top face 1a. Further, the wiring substrate 1 has a core member 1d as a base material layer having insulation property, a conductive layer (conductive pattern, wiring layer) 1e formed on the top face side and the on the under face side of the core member 1d, and a solder resist layer (insulating film, solder resist layer) 1f as an insulating layer (insulating film) formed so as to cover the conductive layer 1e. As another form, the wiring substrate 1 can be formed by a multilayer wiring substrate in which a plurality of insulating layers and a plurality of wiring layers are stacked (for example, a wiring substrate having four wiring layers). That is, the structure of the wiring substrate 1 is not limited to the structure illustrated in FIG. 1. The conductive layer 1e is made of a conductive material and can be formed by, for example, a copper thin film formed by plating.

On the top face side of the wiring substrate 1, the plurality of bonding leads 1c as coupling terminals (electrodes) for electrically coupling the wires 4 are formed. On the other hand, on the under face side of the wiring substrate 1, the plurality of electrodes (lands) for coupling the solder balls 5 are formed. The plurality of bonding leads 1c on the top face side of the core member 1d and the plurality of lands on the under face side of the core member 1d are electrically coupled.

Therefore, the plurality of electrode pads 2c of the semiconductor chip 2 are electrically coupled to the plurality of bonding leads 1c of the wiring substrate 1 via the plurality of wires 4 and further electrically coupled to the plurality of electrodes (lands) of the wiring substrate 1 via the conductive layer 1e of the wiring substrate 1.

The solder resist layer 1f has the function as the insulating layer (insulating film) protecting the conductive layer 1e and covers the conductive layer 1e on the top face side and the under face side of the core member 1d. The semiconductor chip 2 is mounted over the solder resist layer 1f on the side of the top face 1a of the wiring substrate 1 via the adhesive 7.

The wire 4 is, for example, a metal thin line such as a gold wire.

The solder balls 5 are arranged in an array shape (lattice shape) on the side of the under face 1b of the wiring substrate 1 and can function as external terminals (external coupling terminals) of the BGA 3.

The sealing part (sealing resin layer, sealing resin, sealing resin part, or sealing member) 6 is made of a resin material such as a thermosetting resin material and can include fillers or the like. For example, the sealing part 6 can be formed by using an epoxy resin including fillers or the like. The sealing part 6 covers the semiconductor chip 2 and the plurality of wires 4 over the top face 1a of the wiring substrate 1. That is, the sealing part 6 is formed over the top face 1a of the wiring substrate 1 and seals and protects the semiconductor chip 2 and the wires 4.

In the BGA 3 of the embodiment, as illustrated in FIG. 2, in the surface of any of the plurality of solder balls 5, a first impression 5a extending in the thickness direction S of the wiring substrate 1 and a second impression 5b extending in a direction P crossing the extension direction of the first impression 5a are formed. The direction P is a direction orthogonal to the thickness direction S of the wiring substrate 1. The first and second impressions 5a and 5b are formed by first and second projection parts 11b and 11c illustrated in FIG. 5 of a contact pin 11a of a contact part 11 in a socket 8 when the BGA 3 is attached to the socket 8 illustrated in FIG. 4 which will be described later and a burn-in test is performed in a burn-in process of the BGA 3.

The extension direction (the direction along the thickness direction S of the wiring substrate 1) of the first impression 5a and the extension direction (the direction along the direction P) of the second impression 5b are almost orthogonal to each other.

The second impression 5b is formed in the surface on the side of the wiring substrate 1 of the solder ball 5. Specifically, the second impression 5b is formed in the surface on the wiring substrate 1 side (upper side) of the cut plane in the horizontal direction (the direction parallel to the direction P) passing the center C of the solder ball 5 in the surface of the solder ball 5. On the other hand, the first impression 5a is formed in a position extending in both the surface on the wiring substrate 1 side (upper side) of the cut plane in the horizontal direction passing the center C of the solder ball 5 in the surface of the solder ball 5 and the surface on the opposite side (lower side).

Therefore, the second impression 5b is formed in a position near the upper end of the first impression 5a.

Length L1 in the extension direction (direction S) of the first impression 5a is longer than length L2 along the extension direction (direction P) of the second impression 5b (L1>L2).

Further, length (width) W1 along the width direction (direction P) of the first impression 5a is shorter than length (width) W2 along the width direction (direction S) of the second impression 5b (W1<W2).

In the structure illustrated in FIG. 2, a set is made of two first impressions 5a and one second impression 5b. The one second impression 5b is formed in the position between the two first impressions 5a and in the position close to the upper ends of the first impressions 5a. In one, some, or all of the plurality of solder balls 5 in the BGA 3, an impression group M made of two first impressions 5a and one second impression 5b is formed in one or a plurality of places. For example, in positions facing each other in the surfaces of the plurality of solder balls 5, the impression groups M each made of two first impressions 5a and one second impression 5b are formed.

Semiconductor Device Manufacturing Method

Figure 3:
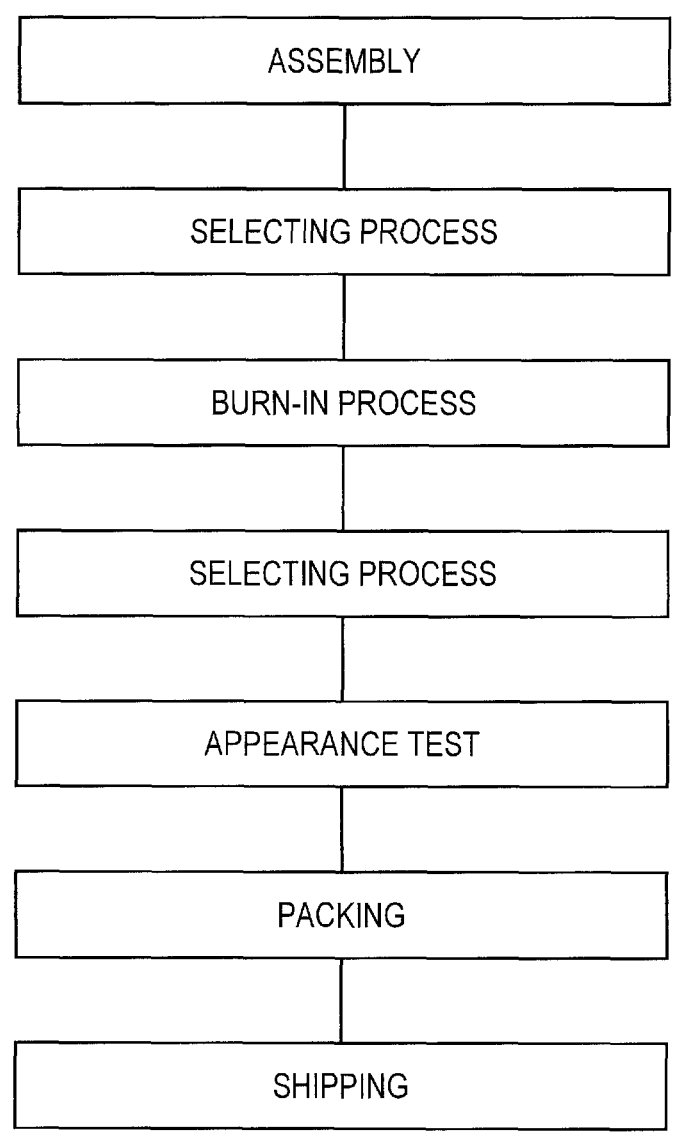
FIG. 3 is a flowchart illustrating an example of processes from assembly to shipping of the semiconductor device of FIG. 1.

FIG. 3 is a flowchart illustrating an example of processes from assembly to shipping of the semiconductor device of FIG. 1. The flow from assembly to shipping of the BGA 3 will be described with reference to FIG. 3.

First, in assembly of the BGA 3 illustrated in FIG. 1, die bonding of mounting the semiconductor chip 2 over the wiring substrate 1 via the adhesive 7 is performed.

After the die bonding, wire bonding of electrically coupling the electrode pads 2c of the semiconductor chip 2 and the bonding leads 1c of the wiring substrate 1 is performed.

After the wire bonding, resin molding of forming the sealing part 6 by sealing the semiconductor chip 2 and the plurality of wires 4 with a resin is performed.

After the resin molding, ball mounting of forming the plurality of solder balls 5 on the under face 1b side of the wiring substrate 1 is performed.

Since the BGA 3 illustrated in FIG. 1 is a BGA 3 having a structure employing assembly using batch molding as an example, in this case, after performing ball mounting of attaching the plurality of solder balls 5 to the under face 1b of the wiring substrate 1, the wiring board 1 is divided into pieces by dicing. By the operation, assembly of the BGA 3 is completed.

After the assembly of the BGA 3, a selecting process of the first time, that is, a selecting process before a burn-in test is performed to select a defective. After the selecting process of the first time, a burn-in process is performed. In the burn-in process, in a state where the BGA 3 is attached to the socket 8 in the burn-in board (refer to FIG. 4), a burn-in test is performed by applying current and voltage to the BGA 3 under a high-temperature environment.

After the burn-in test, a selecting process of the second time is performed to select a defective after the burn-in test.

After the selecting process of the second time, an appearance test is performed to the BGAs 3 determined as good items in the selecting process after the burn-in test. After the appearance test, products are packed and shipped.

Burn-in Process

Figure 4:
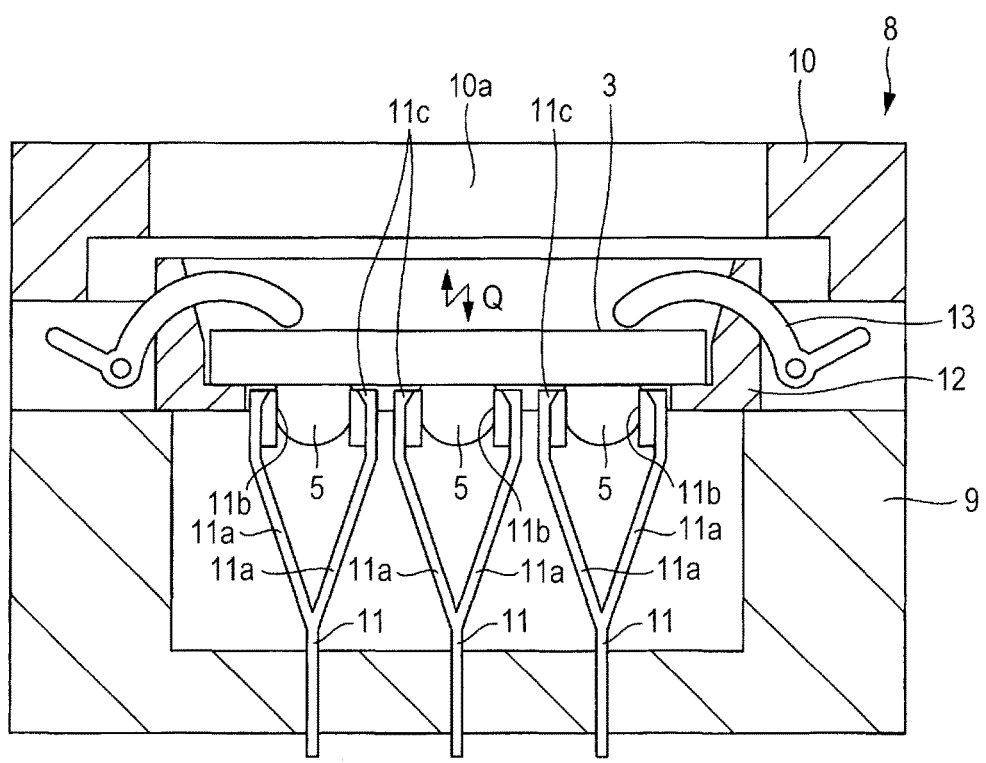
FIG. 4 is a cross section illustrating an example of the structure of a socket used in a burn-on process in the flow of FIG. 3.
Figure 5:
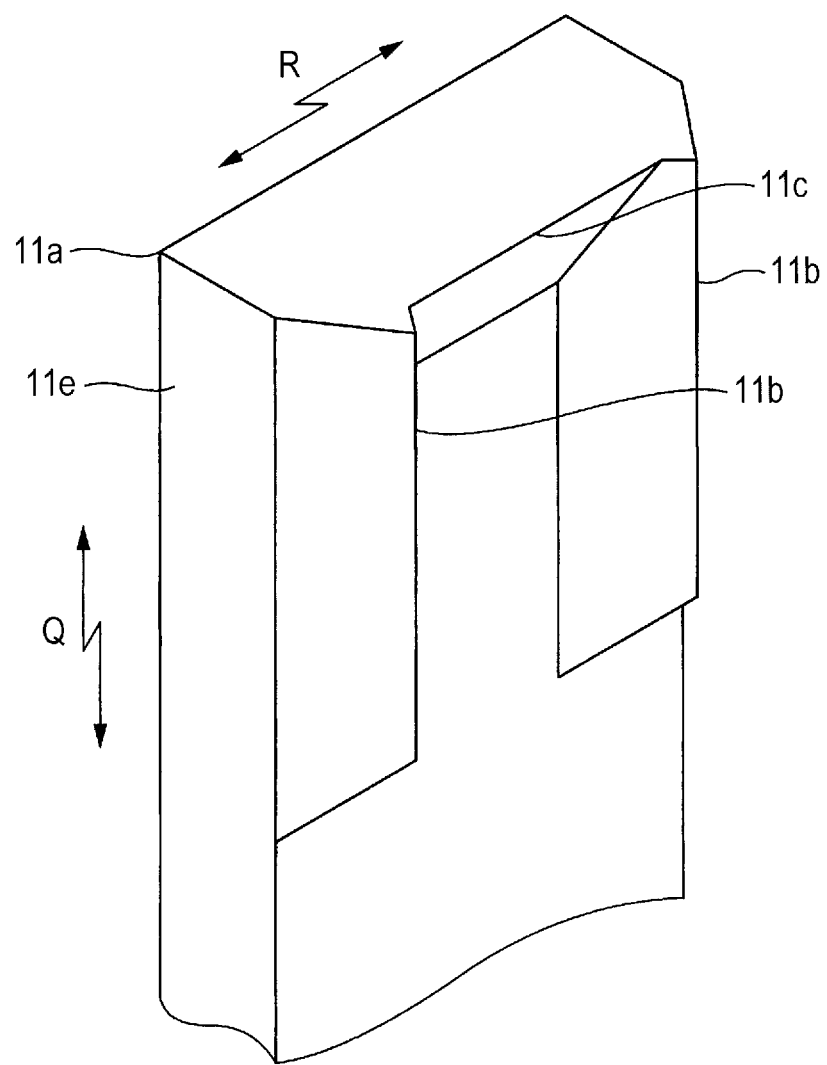
FIG. 5 is a partial perspective view illustrating an example of the structure of a projection part of a contact pin provided for the socket illustrated in FIG. 4.
Figure 6:
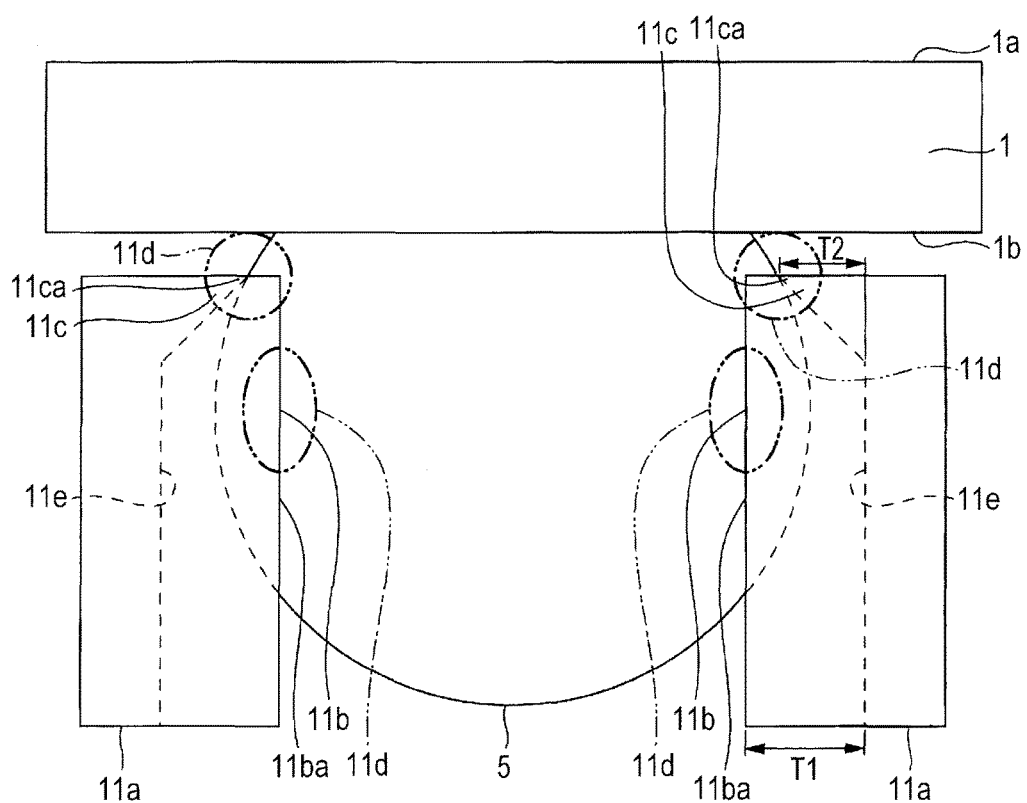
FIG. 6 is a side view illustrating an example of a state of contact to a ball electrode by contact pins of the embodiment.
Figure 7:
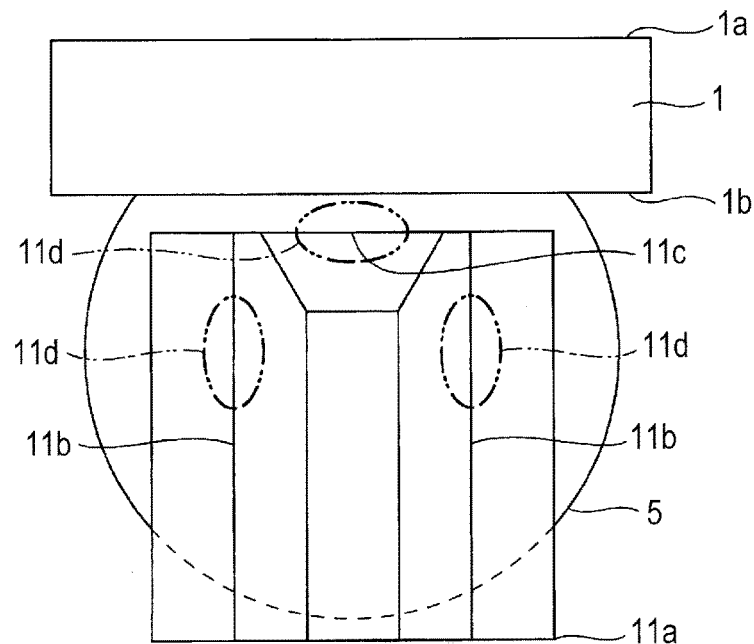
FIG. 7 is a front view illustrating an example of a state of contact to a ball electrode by the contact pins depicted in FIG. 6.
Figure 8:
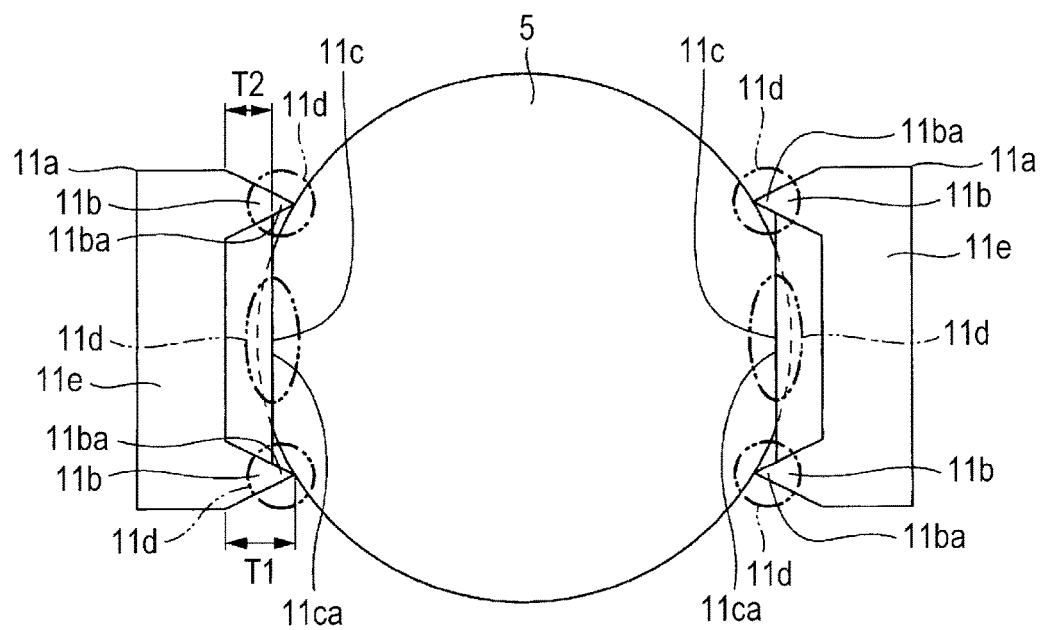
FIG. 8 is a plan view illustrating an example of a state of contact to the ball electrode by the contact pins depicted in FIG. 6.
Figure 9:
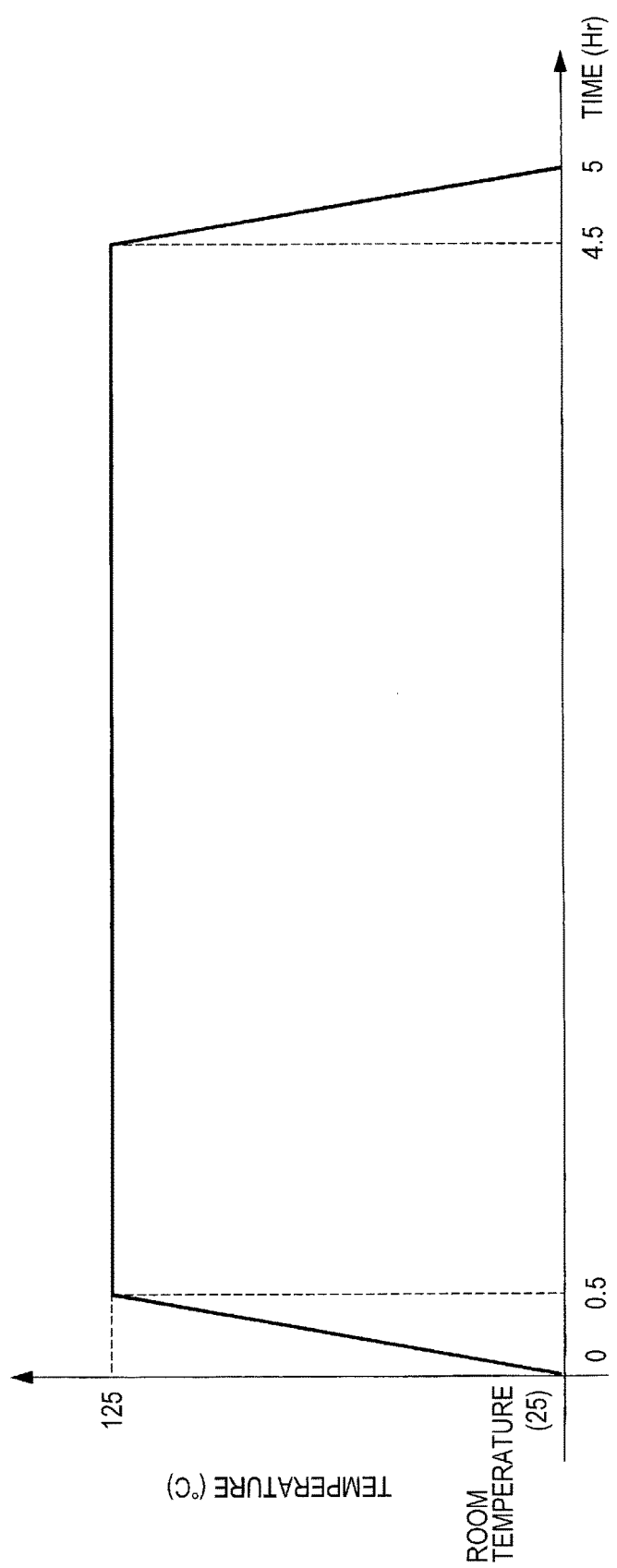
FIG. 9 is a graph illustrating an example of a temperature change at the time of a burn-in in the burn-in process in FIG. 3.
Figure 10:
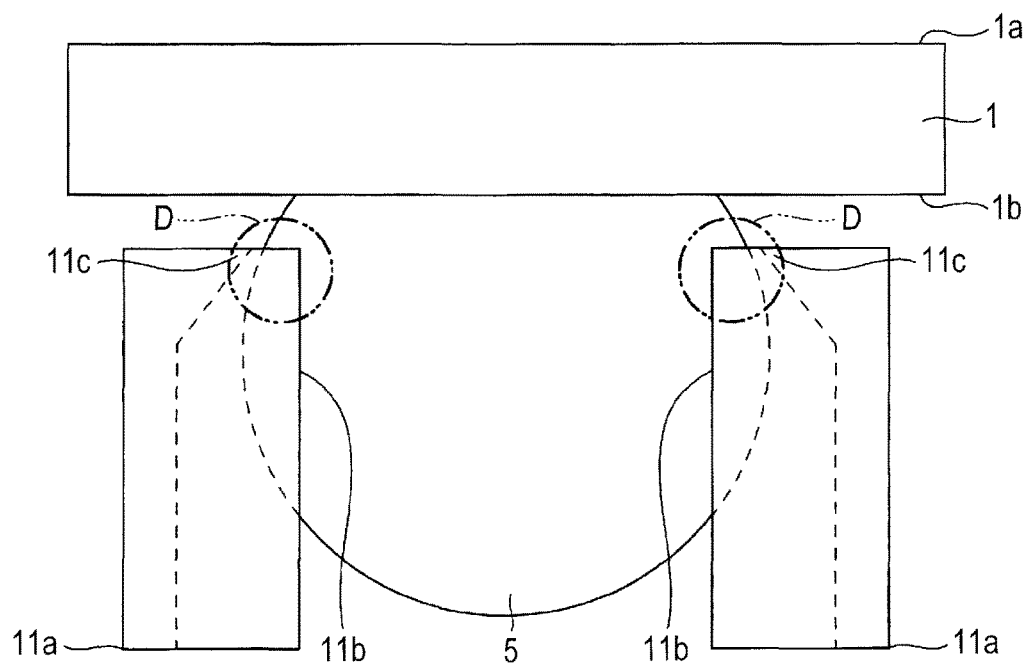
FIG. 10 is a side view illustrating an example of a pin contact state at a burn-in start time point at the time of the burn-in depicted in FIG. 9.
Figure 11:
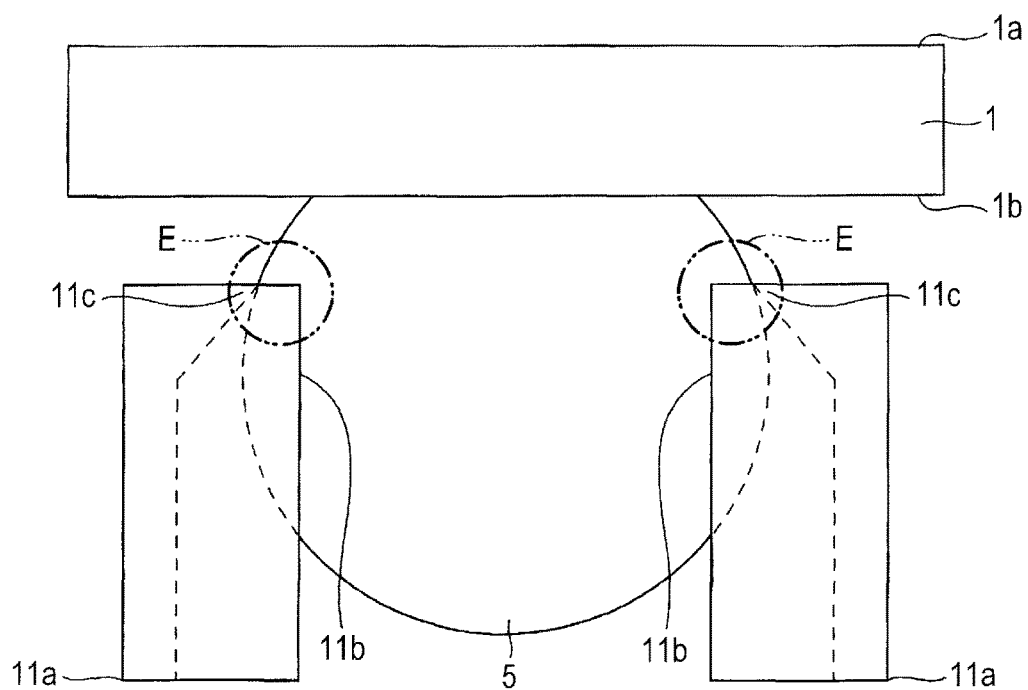
FIG. 11 is a side view illustrating an example of a pin contact state after BGA deformation at the time of the burn-in depicted in FIG. 9.
Figure 12:
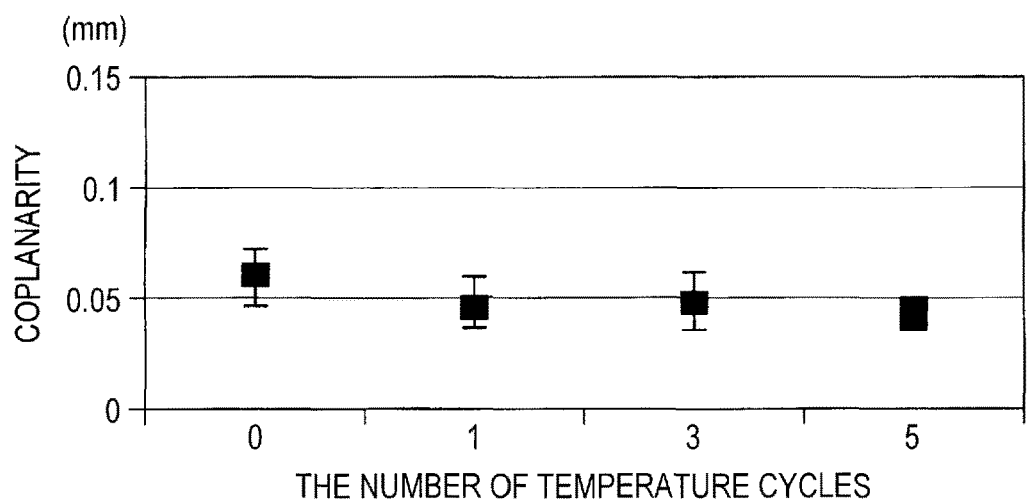
FIG. 12 is a graph illustrating a change in coplanarity by the number of temperature cycle times of the BGA of the embodiment.

FIG. 4 is a cross section illustrating an example of the structure of the socket used in the burn-on process in the flow of FIG. 3. FIG. 5 is a partial perspective view illustrating an example of the structure of a projection part of a contact pin provided for the socket illustrated in FIG. 4. FIG. 6 is a side view illustrating an example of a state of contact to a ball electrode by contact pins of the embodiment. FIG. 7 is a front view illustrating an example of a state of contact to a ball electrode by the contact pins depicted in FIG. 6. FIG. 8 is a plan view illustrating an example of a state of contact to the ball electrode by the contact pins depicted in FIG. 6. FIG. 9 is a graph illustrating an example of a temperature change at the time of a burn-in in the burn-in process illustrated in FIG. 3. FIG. 10 is a side view illustrating an example of a pin contact state at a burn-in start time point at the time of the burn-in depicted in FIG. 9. FIG. 11 is a side view illustrating an example of a pin contact state after BGA deformation at the time of the burn-in depicted in FIG. 9. FIG. 12 is a graph illustrating a change in coplanarity by the number of temperature cycle times of the BGA of the embodiment.

First, the structure of the socket 8 used in the burn-in process illustrated in FIG. 4 will be described. The socket 8 is also called an open-top socket and is a socket of a sandwich type for a BGA which is mainly used in the burn-in process.

The socket 8 has a seat 12 supporting the wiring substrate 1 of the BGA 3, a base 9 to which the seat 12 is attached, a cover 10 provided so as to be opposed to the base 9 and having an opening 10a through which the BGA 3 can be passed, a latch 13 pressing the attached BGA 3, and a plurality of contact parts 11 attached to the base 9 and sandwiching the solder balls 5 of the BGA 3.

Further, each of the plurality of contact parts 11 has a plurality of contact pins (pin members) 11a sandwiching the solder ball 5. Specifically, by sandwiching the solder ball 5 of the BGA 3 by the plurality of contact pins 11a, the solder ball 5 of the BGA 3 and the contact pin 11a are electrically coupled. Further, the contact part 11 having the contact pins 11a is electrically coupled to a wire of the burn-in board, thereby applying voltage to the BGA 3 via the contact part 11 from the burn-in board in the burn-in test.

Each of the contact pins 11a of the socket 8 of the embodiment has, as illustrated in FIG. 5, the first and second projection parts 11b and 11c having conductivity property. Each of the first and second projection parts 11b and 11c is also called a rib and is a part projected from an arm part 11e in the contact pin 11a. The first projection part 11b is provided so as to extend along the attachment direction Q to the socket 8 of the BGA 3 illustrated in FIG. 4. On the other hand, the second projection part 11c is provided so as to extend along the direction R crossing the extension direction (the attachment direction Q) of the first projection part 11b and is displaced so as to face the surface on the attachment side of the BGA 3 of the solder ball 5.

The surface on the attachment side of the BGA 3 of the solder ball 5 denotes the surface on the wiring substrate 1 side (upper side) of the cut plate in the horizontal direction passing the center C of the solder ball 5 illustrated in FIG. 2 (the direction parallel to the direction P).

Consequently, in the burn-in process, a burn-in test of the BGA 3 is performed in a state where the first projection part 11b of the contact pin 11a is in contact with the solder ball 5. That is, the first projection part 11b is a projection part to obtain electric coupling (assure conductivity) with the solder ball 5. On the other hand, the second projection part 11c is a projection part (blade) of preventing coming off to the upward (pop-up) from the contact pin 11a of the solder ball 5.

In the socket 8 of the embodiment, as illustrated in FIG. 5, each of the plurality of contact pins 11a is provided with the two first projection parts 11b arranged in almost parallel and one second projection part 11c.

The second projection part 11c is arranged in a position at an end of the wiring substrate 1 side (upper side) in the extension direction of the first projection part 11b. In another expression, as illustrated in FIGS. 6 and 7, the second projection part 11c is arranged on the wiring substrate 1 side (upper side) of a contact part 11d between the first projection part 11b and the solder ball 5. That is, the contact part 11d of the second projection part 11c is in a position closer to the wiring substrate 1 (upper side) than the contact part 11d of the first projection part 11b.

As illustrated in FIGS. 6 and 8, a projection amount T2 to the solder ball 5 side of the second projection part 11c is smaller than a projection amount T1 to the solder ball 5 side of the first projection part 11b (T2<T1). Specifically, the projection amount T2 from the arm part 11e of a tip 11ca of the second projection part 11c is smaller than the projection amount T1 from the arm part 11e of a tip 11ba of the first projection part 11b (T2<T1).

Next, the temperature environment at the time of the burn-in test will be described with reference to FIG. 9.

FIG. 9 illustrates an example of the temperature environment of the burn-in test. In a burn-in test illustrated in FIG. 9, the temperature is increased from room temperature of 25° C. to 125° C. in 30 minutes (half an hour) from start. After that, it is left for four hours in a state where the 125° C. is maintained. After lapse of the four hours, the temperature is reset to the room temperature of 25° C. in 30 minutes (half an hour). The burn-in test is performed in such a temperature cycle.

First, attachment of the BGA 3 to the socket 8 as illustrated in FIG. 4 is performed. The socket 8 has, as illustrated in FIG. 10, a pair of contact pins 11a opposed to each other and each having the two first projection parts 11b and one second projection part 11c. The cover 10 is lifted upward so that the latch 13 and the contact pins 11a are in an open state. In this state, the BGA 3 is mounted over the seat 12 via the opening 10a in the cover 10. After the mounting, by making the cover 10 free, the cover 10 rises, the latch 13 presses the BGA 3, and the contact pins 11a are closed to sandwich the solder ball 5.

After that, in a state where the solder ball 5 is sandwiched by the first projection parts 11b of the contact pins 11a arranged opposed to each other, the burn-in test of the BGA 3 is performed.

FIG. 10 illustrates the pin contact state at the start time point of the burn-in test. At the start time point of the burn-in test, although the first projection parts 11b of the contact pins 11a are in contact with the solder ball 5, the second projection parts 11c are apart from the solder ball 5 as illustrated in portions D in FIG. 10. That is, at the start time point of the burn-in test, the second projection part 11c is not in contact with the solder ball 5.

This is because the second projection part 11c is arranged so as to face the surface of on the attachment side of the BGA 3 of the solder ball 5 and the projection amount T2 to the solder ball 5 side of the second projection part 11c illustrated in FIG. 6 is smaller than the projection amount T1 to the solder ball 5 side of the first projection part 11b (T2<T1). That is, since the projection amount of the first projection part 11b is larger than that of the second projection part 11c, although the first projection part 11b and the solder ball 5 are in contact, the second projection part 11c arranged in a position upper than the contact part is apart from the solder ball 5.

As the BGA 3 is deformed by the temperature cycle such as temperature rise and temperature fall, the solder ball 5 is lifted upward as illustrated in FIG. 11. At this time, the second projection part 11c comes into contact with the solder ball 5 (portions E in FIG. 11). When the second projection part 11c comes into contact with the solder ball 5, further rise of the solder ball 5 can be stopped, so that the solder ball 5 can be prevented from coming off from the contact pins 11a. That is, since the projection amount of the second projection part 11c is smaller than that of the first projection part 11b and the second projection part 11c is not in contact with the solder ball 5 at the start time point, there is flexibility of movement in the vertical directions when the BGA 3 is defamed by heat in the burn-in test. When the BGA 3 is lifted by deformation of the BGA 3, the solder ball 5 also rises. As illustrated in FIG. 11, however, the solder ball 5 comes into contact with the second projection part 11c and the rise of the solder ball 5 stops.

It can prevent the solder ball 5 from coming off from the contact pin 11a in the burn-in test. That is, occurrence of pop-up that the solder ball 5 is lifted and comes off from the contact pin 11a is suppressed and occurrence of poor contact can be reduced.

Further, the vertical movement of the solder ball 5 is reduced by the second projection part 11c, and formation of a scar in the under face 1b of the wiring substrate 1 can be suppressed.

As illustrated in FIG. 12, after the burn-in test using the socket 8 of the embodiment, the changes in the coplanarity of the BGA 3 were measured. As a result, fluctuations in coplanarity can be reduced, and coplanarity can be improved.

Therefore, the reliability of the BGA 3 can be improved. In addition, the reliability in the burn-in test of the BGA 3 can be increased.

By the contact between the first projection part 11b and the solder ball 5 for obtaining electric coupling between the contact pin 11a and the solder ball 5, the first impression 5a illustrated in FIG. 2 is famed in the solder ball 5. By the contact between the second projection part 11c and the solder ball 5 when the solder ball 5 is lifted upward, the second impression 5b illustrated in FIG. 2 is formed in the solder ball 5.

As illustrated in FIGS. 6 and 8, the first projection part 11b is longer than the second projection part 11c in the contact pin 11a. Consequently, also when the solder ball 5 shifts upward, electric coupling (conduction) between the first projection part 11b and the solder ball 5 can be assured. Since the second projection part 11c is provided for suppressing pop-up of the solder ball 5, the length of the second projection part 11c is not necessary as compared with the first projection part 11b.

Next, by the BGA 3 of the embodiment, in a manner similar to the above, coplanarity can be improved. Thus, the reliability of the BGA 3 can be improved. As described above, as the solder ball 5 has flexibility at the time of a burn-in test, stress on the solder ball 5 can be reduced, and dropout of the solder ball 5 can be suppressed. Further, impressions such as the first and second impressions 5a and 5b formed in the burn-in test can be visually recognized after the burn-in test, and whether contact of the projection parts in the burn-in test is performed properly or not can be recognized.

Arrangement and Open/Close Directions of Contact Pins

Figure 13:
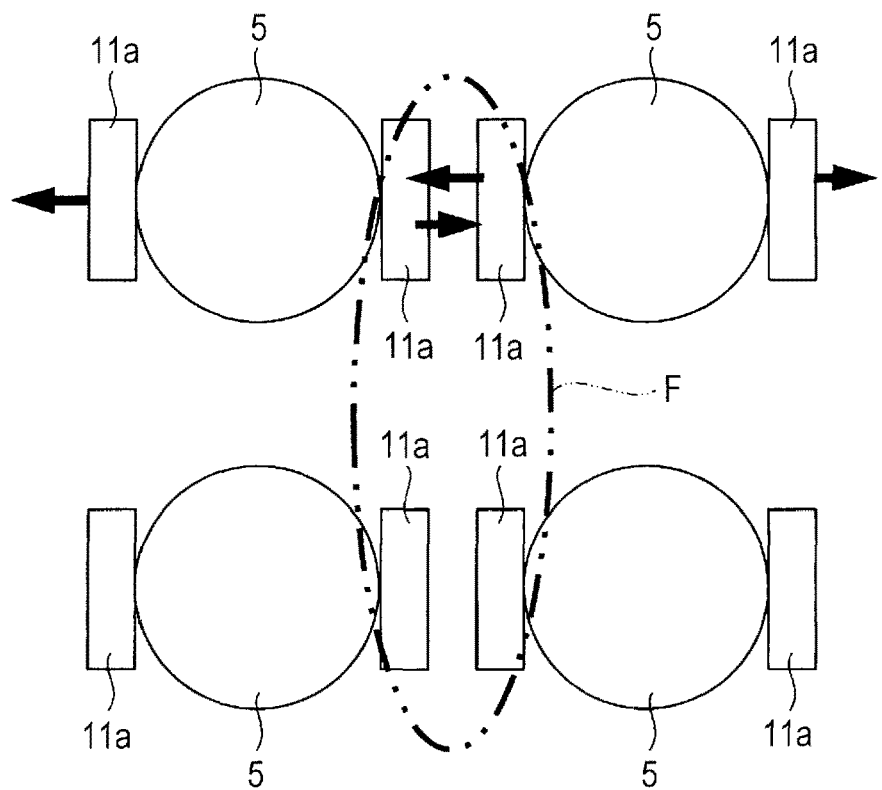
FIG. 13 is a plan view illustrating an open direction of contact pins of a comparison example.
Figure 14:
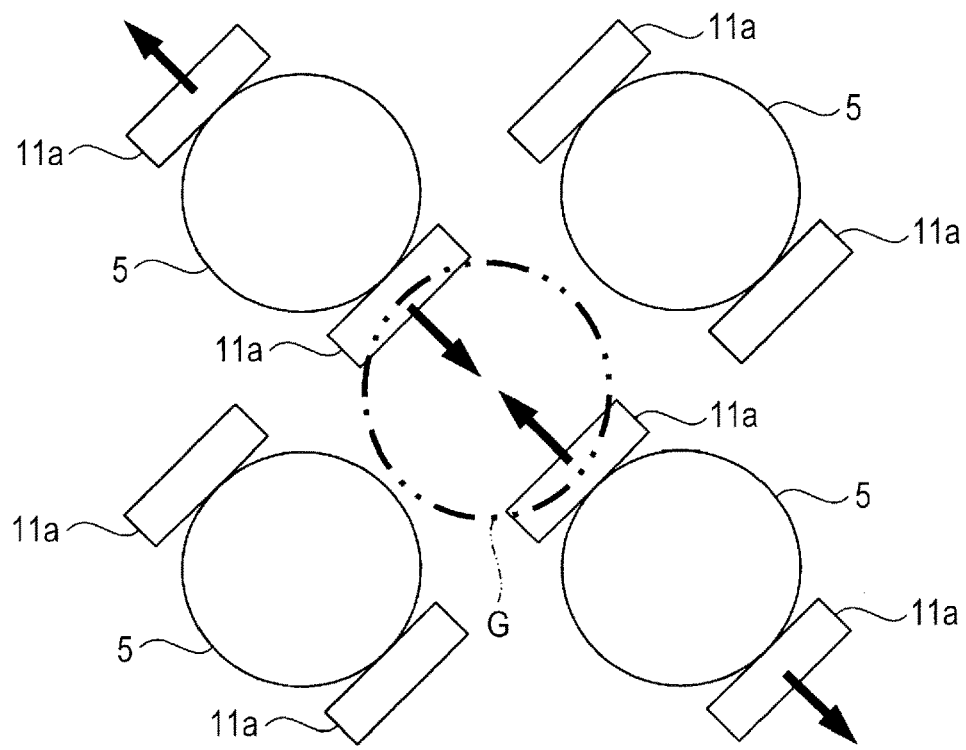
FIG. 14 is a plan view illustrating an example of the open direction of contact pins in the socket of the embodiment.

FIG. 13 is a plan view illustrating an open direction of contact pins of a comparison example, and FIG. 14 is a plan view illustrating an example of the open direction of contact pins in the socket of the embodiment.

As illustrated in the comparison example of FIG. 13, in the case of opening and closing the contact pins 11a arranged so as to face each other in the pitch direction (the same direction as the lattice arrangement of the solder balls 5), the adjacent pin stands in the way and it is difficult to assure a sufficient open amount for inserting the solder ball 5 (F portion in FIG. 13).

As illustrated in FIG. 14, in the pin arrangement of the embodiment, a pair of two contact pins 11a is arranged so as to face each of the solder balls 5, and is opened/closed in a direction orthogonal to the lattice arrangement direction of the plurality of solder balls 5 (G portion in FIG. 14).

In such a manner, the open amount of the contact pins 11a can be sufficiently assured, and attachment/detachment of the solder balls 5 to the contact pins 11a can be performed.

Shape of Tip of Second Projection Part (Shape of Blade)

Figure 15:
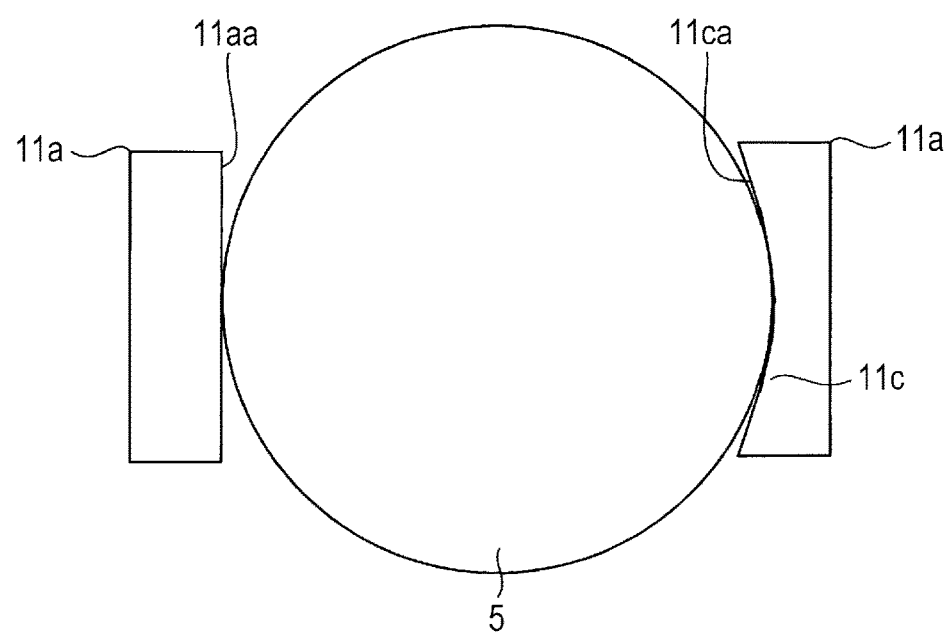
FIG. 15 is a plan view illustrating an example of the shape of the tip of a second projection part in the contact pin in the socket of the embodiment.

FIG. 15 is a plan view illustrating an example of the shape of the tip of the second projection part in the contact pin in the socket of the embodiment.

Preferably, the shape of the tip 11ca in plan view is a shape curved along the circular arc of the solder ball 5 like the second projection part 11c of the contact pin 11a on the right side in FIG. 15. The case where the shape of the tip 11aa in plan view is straight like the contact pin 11a on the left side of FIG. 15 is not preferable because the contact area between the solder ball 5 and the tip 11aa is small and there is the possibility that pop-up of the solder ball 5 easily occurs.

On the other hand, when the shape of the tip 11ca in plan view is a shape curved along the circular arc of the solder ball 5 like the second projection part 11c of the contact pin 11a on the right side of FIG. 15, the contact area with the solder ball 5 increases, so that occurrence of pop-up of the solder ball 5 can be suppressed. Further, since the contact area with the solder ball 5 increases, contact performance to the solder ball 5 can be increased.

The Number of Contact Pins

Figure 16:
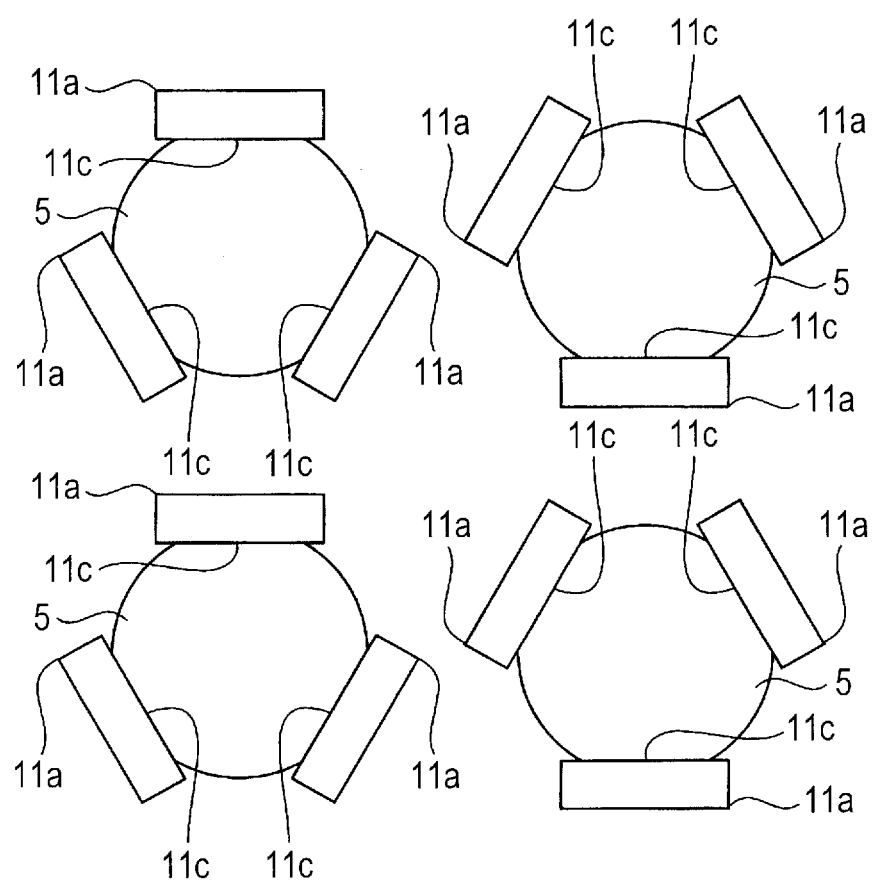
FIG. 16 is a plan view illustrating an example of arrangement of the contact pins in the socket of the embodiment.
Figure 17:
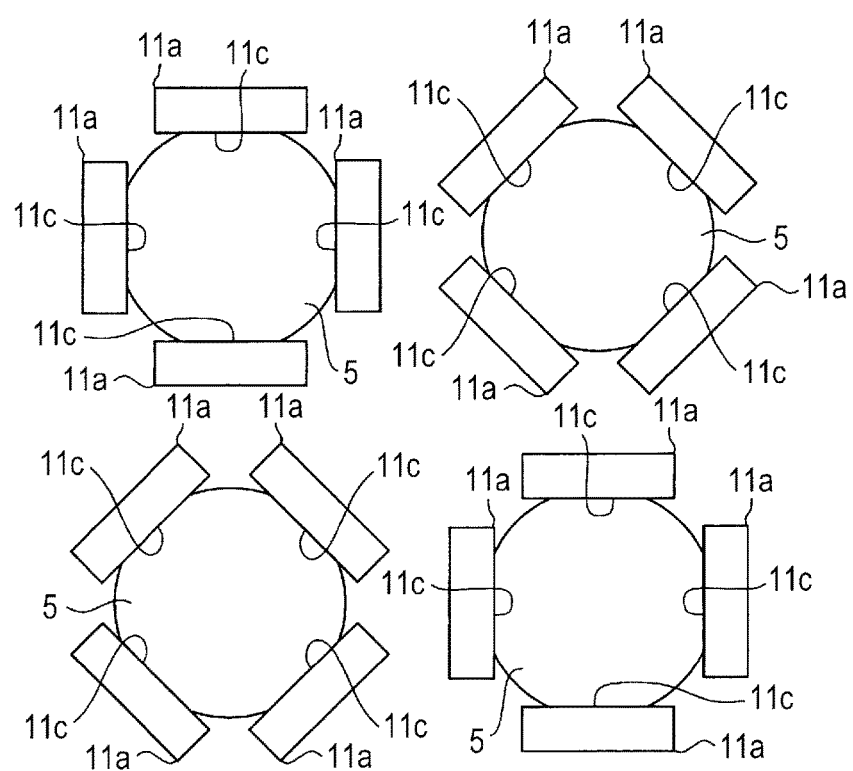
FIG. 17 is a plan view illustrating an example of arrangement of the contact pins in the socket of the embodiment.
Figure 18:
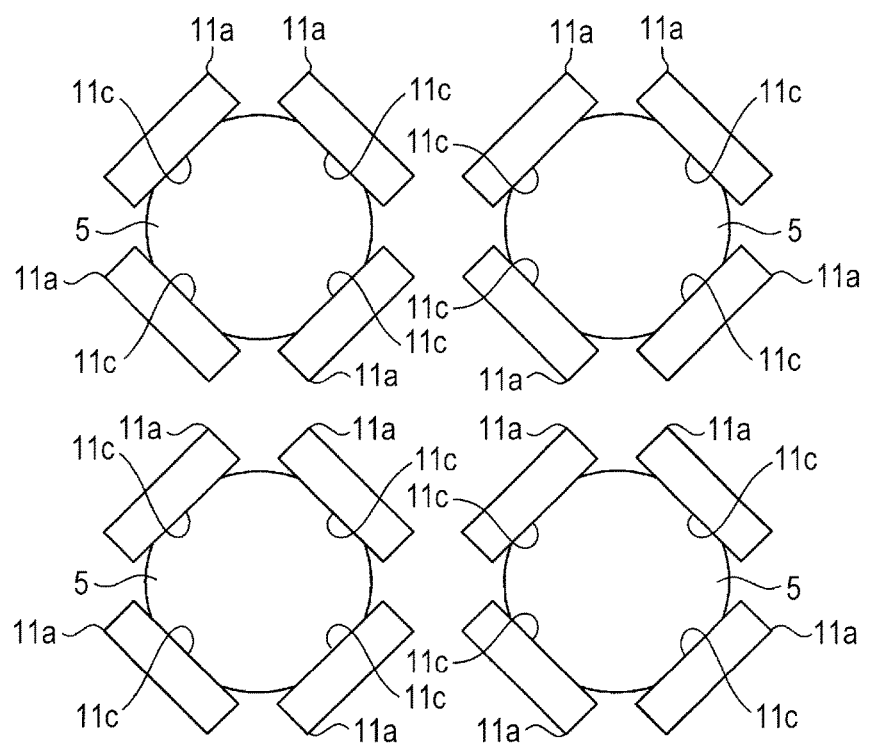
FIG. 18 is a plan view illustrating an example of arrangement of the contact pins in the socket of the embodiment.

FIG. 16 is a plan view illustrating an example of arrangement of the contact pins in the socket of the embodiment. FIG. 17 is a plan view illustrating an example of arrangement of the contact pins in the socket of the embodiment. FIG. 18 is a plan view illustrating an example of arrangement of the contact pins in the socket of the embodiment. In each of the contact pins 11a illustrated in FIGS. 16 to 18, although only the second projection part 11c is illustrated, obviously, the first projection part 11b is also provided.

The structure illustrated in FIG. 16 relates to the case where the number of contact pins 11a sandwiching one solder ball is three. The structure illustrated in FIG. 17 relates to the case where the number of contact pins 11a sandwiching one solder ball is four. In the structures illustrated in FIGS. 16 and 17, the contact pins 11a are arranged so that the directions of the contact pins 11a opening/closing between adjacent solder balls 5 do not match. In any case, it is applicable as long as the open/close space of the contact pins 11a is assured.

The structure illustrated in FIG. 18 relates to the case where the number of contact pins 11a sandwiching one solder ball is four, and the open/close directions of the contact pins 11a are deviated obliquely by 45 degrees from the lattice arrangement of the plurality of solder balls 5. That is, the open/close directions of the contact pins 11a are set to be different from the direction of the lattice arrangement of the solder balls 5. With the arrangement, also in the structure illustrated in FIG. 18, when the open/close space of the contact pins 11a can be assured, it is applicable.

The Number of First Projection Parts and State of Contact to Solder Ball

Figure 19:
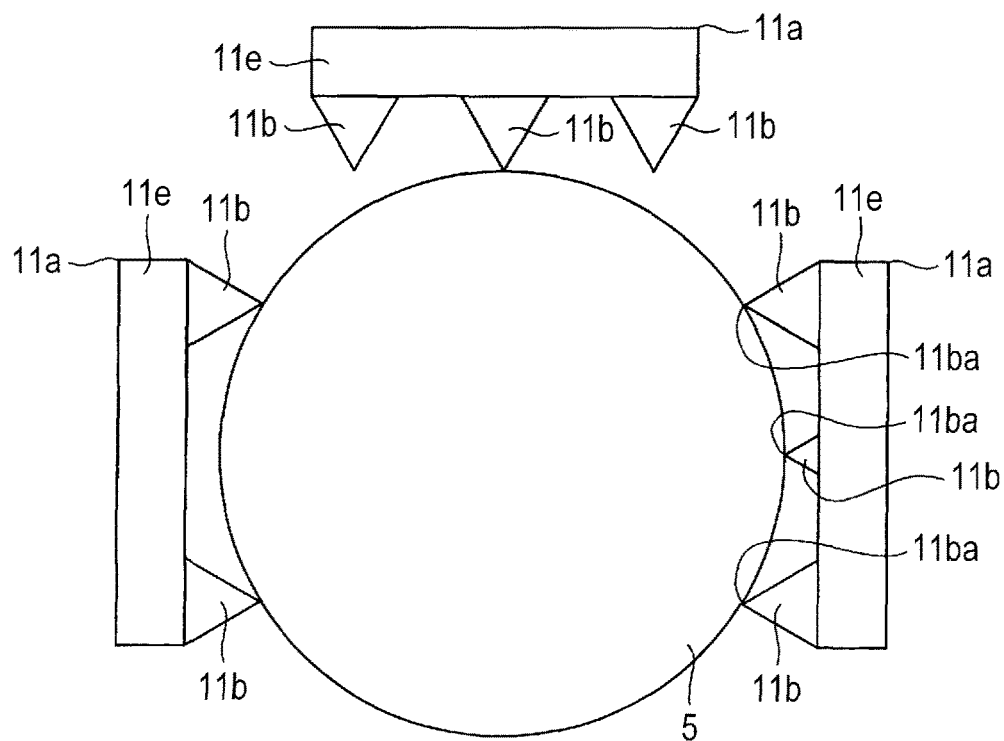
FIG. 19 is a plan view illustrating an example of the number of first projection parts in the contact pin in the socket of the embodiment.
Figure 20:
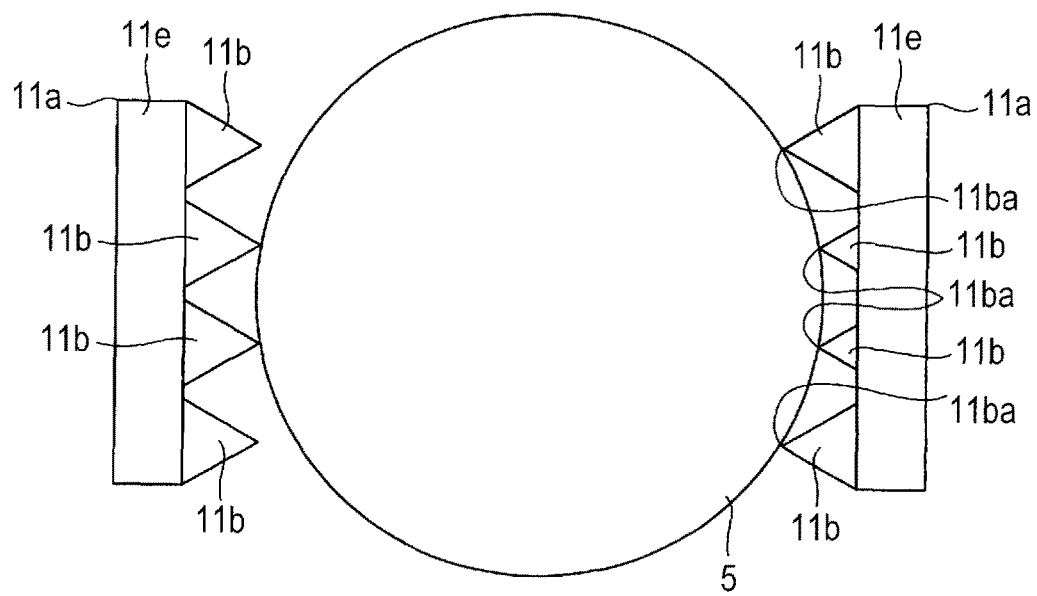
FIG. 20 is a plan view illustrating an example of the number of first projection parts in the contact pin in the socket of the embodiment.

FIG. 19 is a plan view illustrating an example of the number of first projection parts in the contact pin in the socket of the embodiment. FIG. 20 is a plan view illustrating an example of the number of first projection parts in the contact pin in the socket of the embodiment.

The structure of FIG. 19 illustrates the contact state between the first projection parts 11b and the solder ball 5 in each of the case where the number of the first projection parts 11b for one arm part 11e of the contact pin 11a is two (two mountains) and the case where the number is three (three mountains). In the case where the number of the first projection parts 11b is two (two mountains), the contact state between each of the two first projection parts 11b and the solder ball 5 is stable, and electric coupling between the contact pins 11a and the solder ball 5 can be stably assured.

On the other hand, in the case where the number of the first projection parts 11b is three (three mountains), when the three first projection parts 11b have the same height (the contact pin 11a positioned in the center of FIG. 19), only one first projection part 11b arranged in the center in the three first projection parts 11b is in contact with the solder ball 5, and it is not a preferable contact state. Therefore, in the case of the contact pin 11a having three first projection parts 11b (three mountains), it is preferable to make the projection amount of the first projection part 11b arranged in the center of the three first projection parts 11b smaller than that of the first projection parts 11b arranged at both ends (the right contact pin 11a in FIG. 19).

By making the projection amount of the first projection part 11b arranged in the center smaller than that of the first projection parts 11b arranged at both ends, the tips 11ba of the three first projection parts 11b are arranged almost along the outer peripheral shape of the solder ball 5. Consequently, at least two or all of the three first projection parts 11b can be made contact with the solder ball 5, so that electric coupling between the contact pin 11a and the solder ball 5 can be assured.

Next, the structure illustrated in FIG. 20 illustrates the contact state of the first projection parts 11b and the solder ball 5 in the case where the number of first projection parts 11b for one arm part 11e of the contact pin 11a is four.

In the case where the number is four, when all of the four first projection parts 11b have the same height (the contact pin 11a positioned on the left side in FIG. 20), only two first projection parts 11b arranged in the center out of the four first projection parts 11b are in contact with the solder ball 5 and it is not a preferable contact state. Therefore, in the case where the number of first projection parts 11b is four (four mountains), preferably, the projection amount of the two first projection parts 11b arranged in the center area out of the four first projection parts 11b is made smaller than that of the first projection parts 11b arranged at both ends (the contact pin 11a positioned on the right side of FIG. 20).

By making the projection amount of the two first projection parts 11b arranged in the center area smaller than that of the first projection parts 11b arranged at both ends, in a manner similar to the case where the number of the first projection parts 11b is three, the tips 11ba of the four first projection parts 11b are arranged almost along the outer peripheral shape of the solder ball 5. Consequently, at least two, three, or all of the four first projection parts 11b can be made contact with the solder ball 5, so that electric coupling between the contact pin 11a and the solder ball 5 can be assured.

Pin Arrangement and the Number of Second Projection Parts

Figure 21:
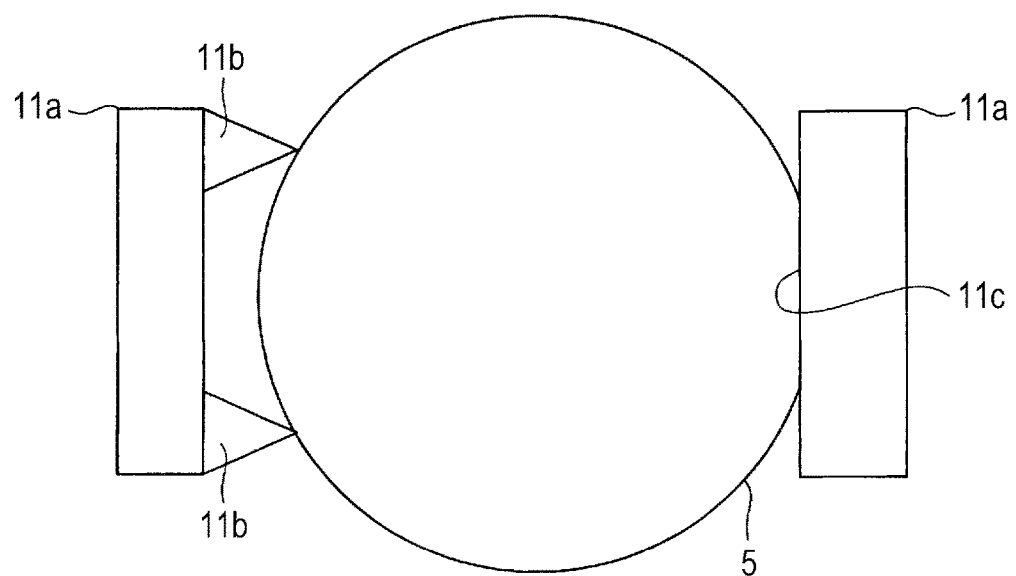
FIG. 21 is a plan view illustrating an example of arrangement of the contact pins in the socket of the embodiment.
Figure 22:
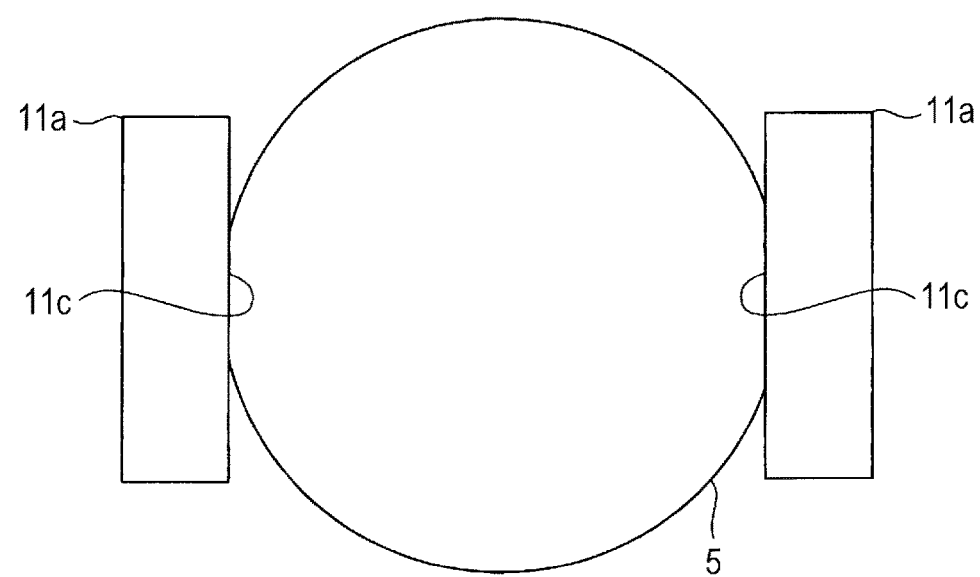
FIG. 22 is a plan view illustrating an example of arrangement of the contact pins in the socket of the embodiment.
Figure 23:
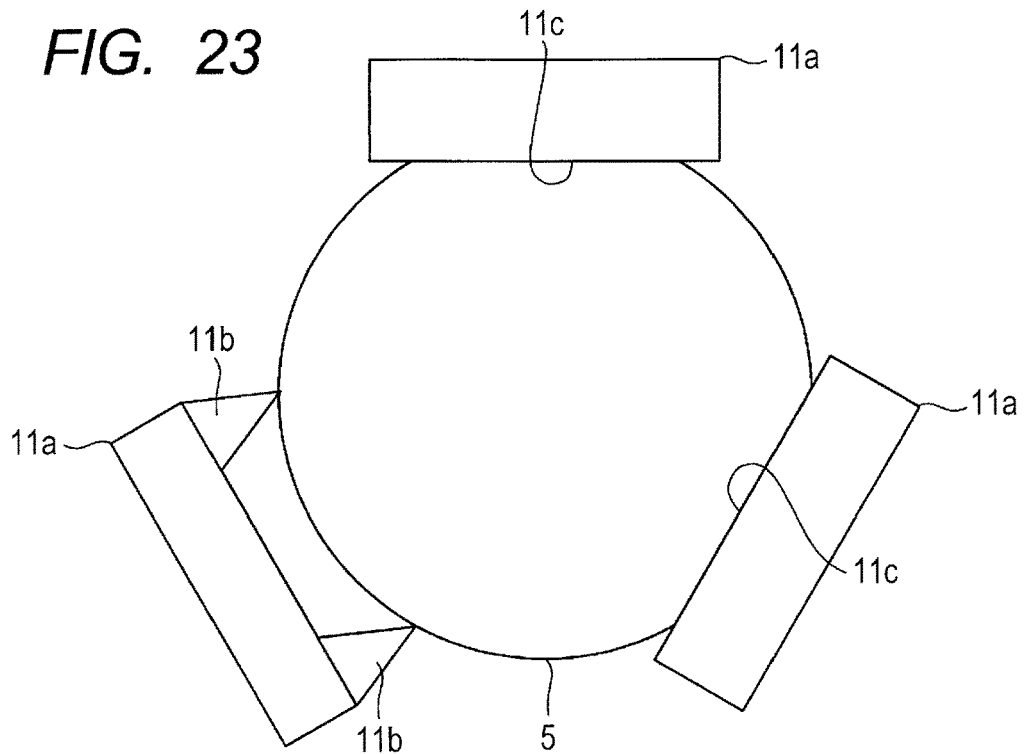
FIG. 23 is a plan view illustrating an example of arrangement of the contact pins in the socket of the embodiment.
Figure 24:
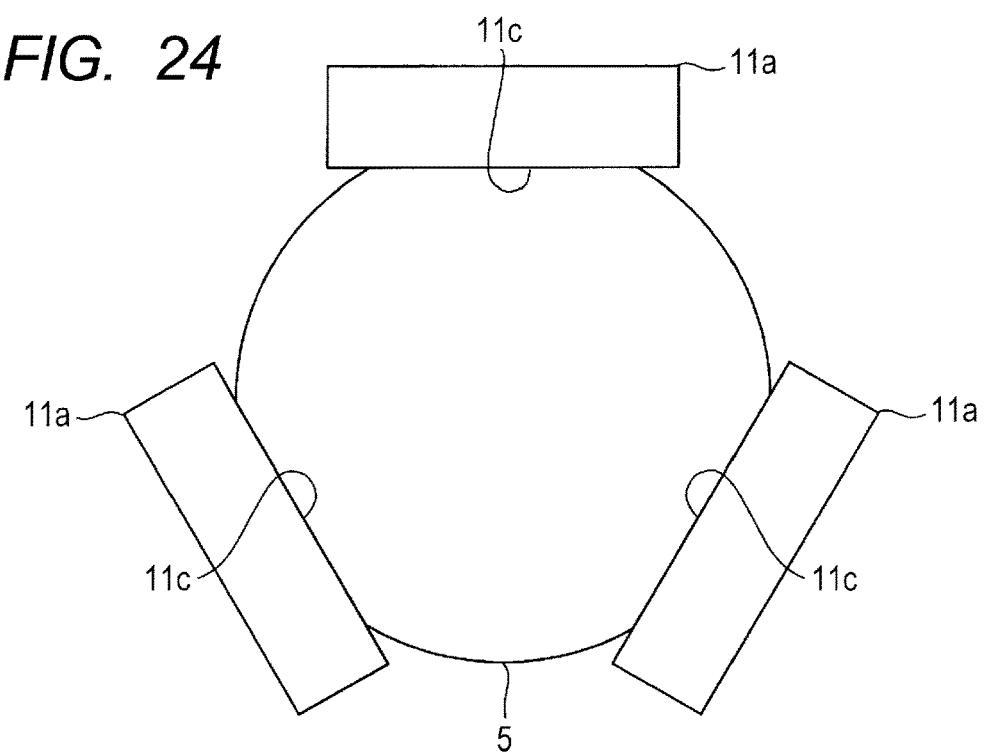
FIG. 24 is a plan view illustrating an example of arrangement of the contact pins in the socket of the embodiment.
Figure 25:
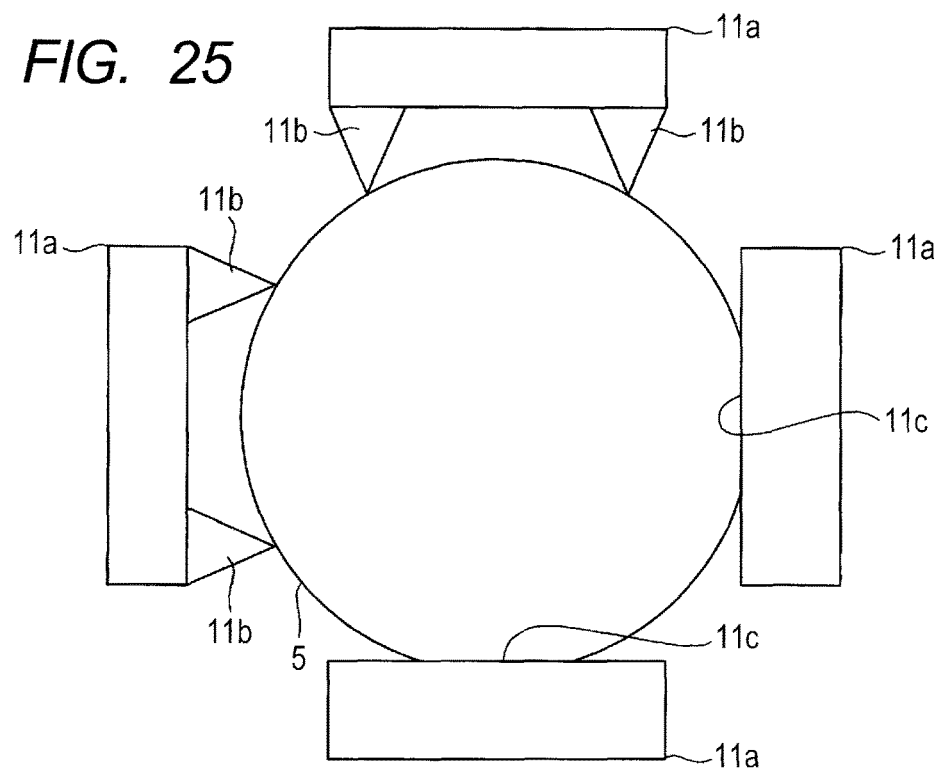
FIG. 25 is a plan view illustrating an example of arrangement of the contact pins in the socket of the embodiment.
Figure 26:
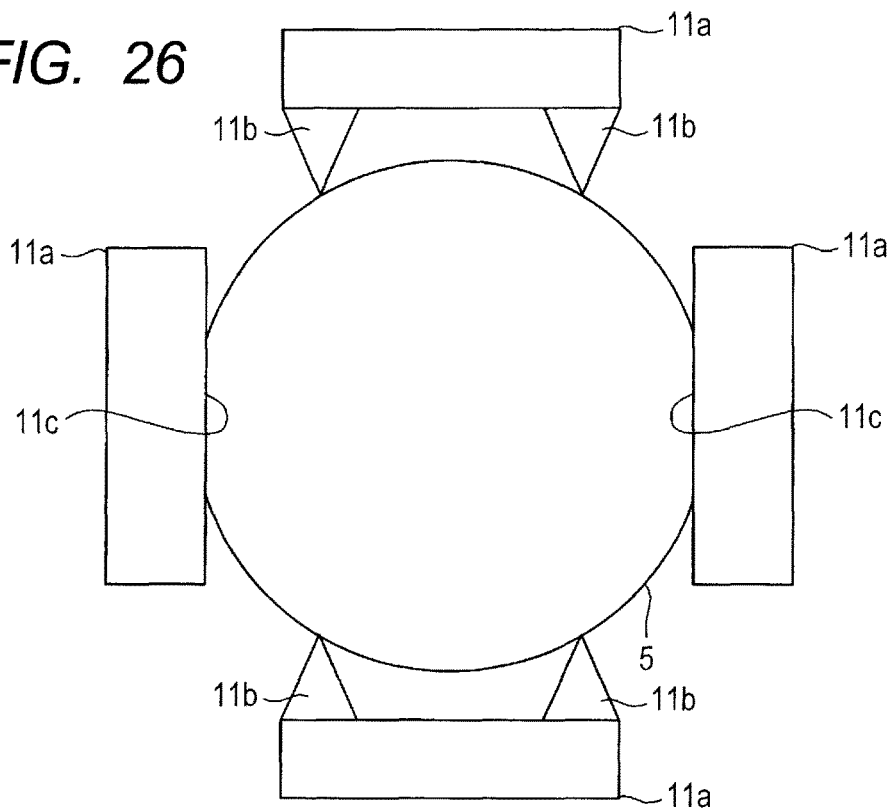
FIG. 26 is a plan view illustrating an example of arrangement of the contact pins in the socket of the embodiment.

FIG. 21 is a plan view illustrating an example of arrangement of the contact pins in the socket of the embodiment. FIG. 22 is a plan view illustrating an example of arrangement of the contact pins in the socket of the embodiment. FIG. 23 is a plan view illustrating an example of arrangement of the contact pins in the socket of the embodiment. FIG. 24 is a plan view illustrating an example of arrangement of the contact pins in the socket of the embodiment. FIG. 25 is a plan view illustrating an example of arrangement of the contact pins in the socket of the embodiment. FIG. 26 is a plan view illustrating an example of arrangement of the contact pins in the socket of the embodiment. Obviously, each of the contact pins 11a each having the second projection part 11c illustrated in the contact pins 11a illustrated in FIGS. 21 to 26 also has the first projection part 11b.

In the structure illustrated in FIG. 21, one of the two contact pins 11a arranged so as to face each other (the left side) is provided with only two first projection parts 11b. In the other contact pin 11a (on the right side), two first projection parts 11b and one second projection part 11c as illustrated in FIG. 5 are formed.

In the structure illustrated in FIG. 22, the two first projection parts 11b and one second projection part 11c as illustrated in FIG. 5 are formed in both of the two contact pins 11a arranged so as to face each other.

Also in the structure illustrated in FIG. 21, the contact pin 11a on one of the sides (right side) of the two contact pins 11a sandwiching the solder ball 5 and facing each other is provided with the second projection part 11c. Consequently, pop-up of the solder ball 5 during the burn-in test can be prevented. Further, in the structure illustrated in FIG. 22, the second projection part 11c is formed in each of both of the contact pins 11a, so that pop-up of the solder ball 5 during the burn-in test can be prevented more.

In the structure illustrated in FIG. 23, one of the three contact pins 11a arranged so as to be dispersed in three directions is provided with only two first projection parts 11b. In each of the remaining two contact pins 11a, two first projection parts 11b and one second projection part 11c as illustrated in FIG. 5 are formed.

In the structure illustrated in FIG. 24, in each of the three contact pits 11a arranged so as to be dispersed in three directions, two first projection parts 11b and one second projection part 11c as illustrated in FIG. 5 are formed.

Also in the structure illustrated in FIG. 23, the second projection part 11c is provided in the two contact pins 11a out of the three contact pins 11a arranged so as to be dispersed in three directions, so that pop-up of the solder ball 5 during the burn-in test can be prevented. Further, also in the structure illustrated in FIG. 24, the second projection part 11c is provided in each of the three contact pins 11a, so that pop-up of the solder ball 5 during the burn-in test can be prevented more.

Next, in the structure of FIG. 25, only two first projection parts 11b are provided in anyone of the set of contact pins 11a facing each other in two sets of (four) contact pins 11a arranged so as to face each other, and two first projection parts 11b and one second projection part 11c as illustrated in FIG. 5 are formed in the other contact pin 11a.

In the structure of FIG. 26, only two first projection parts 11b are provided in each of a set of (two) contact pins 11a out of two sets of (four) contact pins 11a arranged so as to face each other, and two first projection parts 11b and one second projection part 11c as illustrated in FIG. 5 are formed in each of the other set of (two) contact pins 11a.

Also in the structure illustrated in FIG. 25, the second projection part 11c is provided in the other set of contact pins 11a out of the two sets of (four) contact pins 11a arranged so as to face each other, so that pop-up of the solder ball 5 during the burn-in test can be prevented. Further, also in the structure illustrated in FIG. 26, since the second projection part 11c is formed in each of one set of (two) contact pins 11a of any of the sets, pop-up of the solder ball 5 during the burn-in test can be prevented more.

Pin Arrangement in the Case where the Number of First Projection Parts is One

Figure 27:
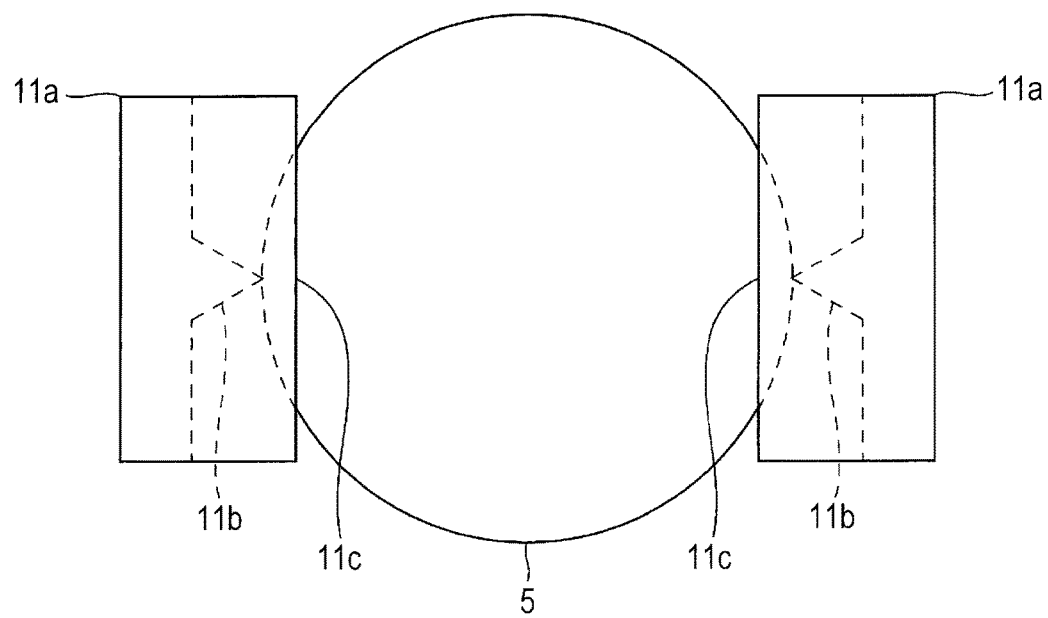
FIG. 27 is a plan view illustrating an example of a state of contact to a ball electrode in the case where the number of first projection parts in the contact pin in the socket of the embodiment is one (one mountain).
Figure 28:
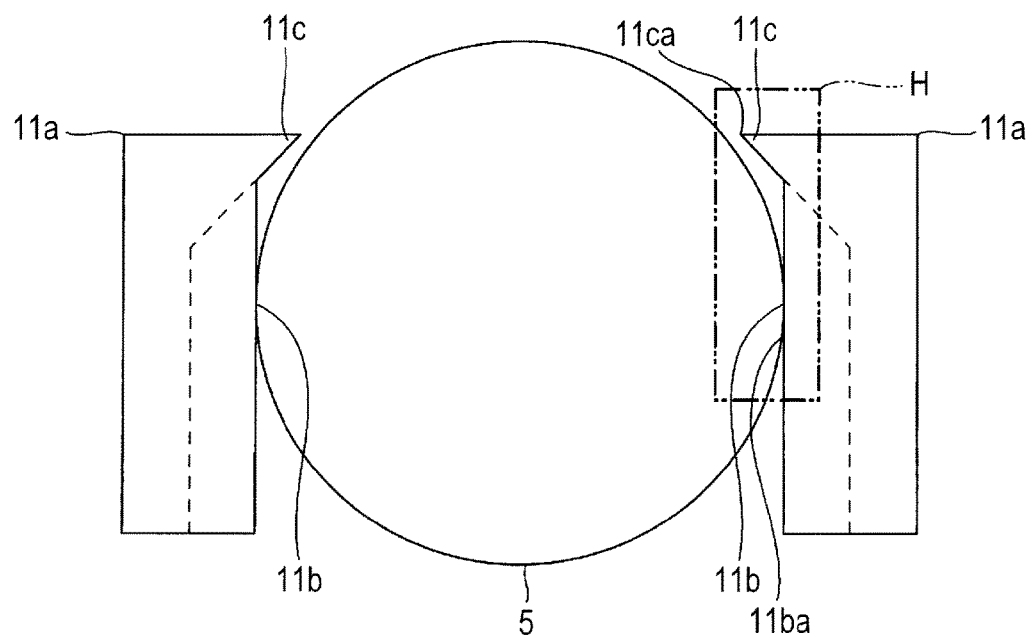
FIG. 28 is a side view illustrating an example of a state of contact to a ball electrode in the case where the number of first projection parts is one as depicted in FIG. 27.
Figure 29:
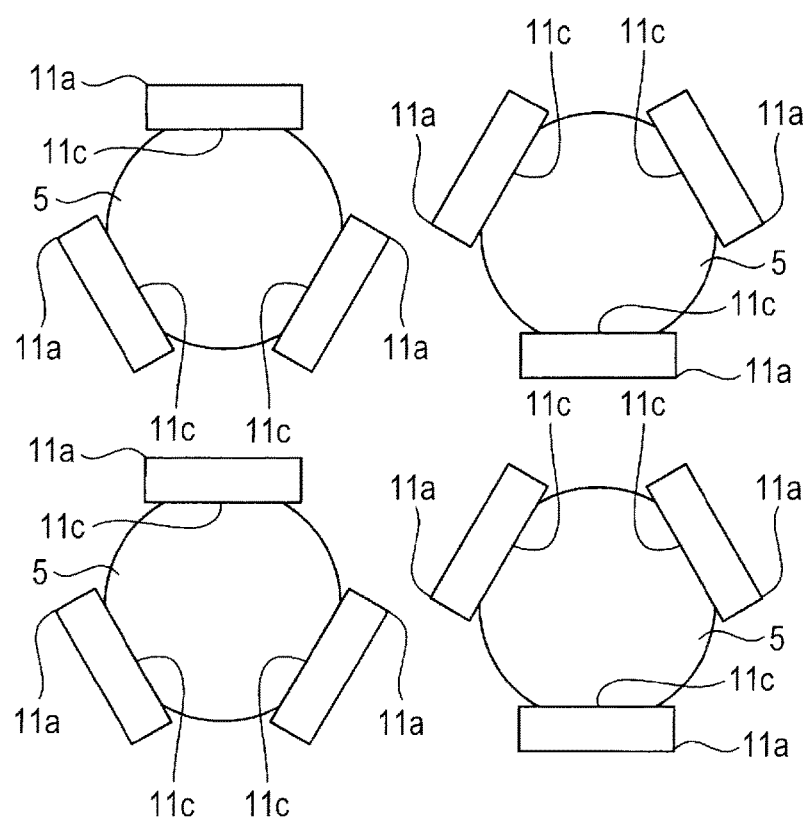
FIG. 29 is a plan view illustrating an example of pin arrangement in the case where the number of the first projection parts of FIG. 27 is one (one mountain) and the number of contact pins is three.

FIG. 27 is a plan view illustrating an example of a state of contact to a ball electrode in the case where the number of the first projection parts in the contact pin in the socket of the embodiment is one (one mountain). FIG. 28 is a side view illustrating an example of a state of contact to a ball electrode in the case where the number of the first projection part in FIG. 27 is one (one mountain). FIG. 29 is a plan view illustrating an example of pin arrangement in the case where the number of the first projection parts of FIG. 27 is one (one mountain) and the number of contact pins is three. Although only the second projection parts 11c are illustrated in the contact pins 11a in FIG. 29, obviously, the first projection parts 11b are also provided.

In the structures illustrated in FIGS. 27 and 28, one contact pin 11a is provided with one first projection part 11b and one second projection part 11, and the contact pins 11a are arranged so as to face each other and sandwich the solder ball 5. In the case of the structure that only one first projection part 11b (one mountain) is provided for one contact pin 11a, as illustrated in the portion H in FIG. 28, the projection amount of the tip 11ca of the second projection part 11c has to be made larger (projected) than that of the tip 11ba of the first projection part 11b.

As described above, in the structure in which one first projection part 11b is provided for one contact pin 11a, by making the projection amount of the tip 11ca of the second projection part 11c larger than that of the tip 11ba of the first projection part 11b, pop-up of the solder ball 5 during the burn-in test can be prevented.

In the structure illustrated in FIG. 29, in the case where one first projection part 11b and one second projection part 11c are provided for one contact pin 11a as illustrated in FIG. 27, the solder ball 5 is sandwiched by the three contact pins 11a arranged so as to be dispersed in three directions. Also in the structure illustrated in FIG. 29, the second projection part 11c is provided for each of the three contact pins 11a arranged so as to be dispersed in three directions, so that pop-up of the solder ball 5 during the burn-in test can be prevented more.

Although the present invention achieved by the inventors herein has been concretely described on the basis of the embodiments, obviously, the invention is not limited to the foregoing embodiments but can be changed variously without departing from the gist.

For example, in the foregoing embodiment, the case where the semiconductor device is the BGA in which the semiconductor chip and the wiring substrate are electrically coupled via wires has been described as an example. However, the semiconductor device may be, for example, a BGA of a structure in which a semiconductor chip and a wiring substrate are electrically coupled via bump electrodes by flip-chip coupling or the like.

What is claimed is:

1. A semiconductor device manufacturing method comprising:
   (a) attaching a semiconductor device having one or more ball electrodes as an external terminal to a socket for a burn-in test; and
   (b) performing a burn-in test of the semiconductor device by sandwiching each ball electrode by a respective conductive contact part of the socket,
   wherein each contact part of the socket is made by a plurality of pin members sandwiching the respective ball electrode,
   wherein each of the plurality of pin members is provided with a pair of first projection parts and one second projection part,
   wherein each first projection part is conductive and extends along an attachment direction of the semiconductor device,
   wherein the second projection part is conductive and is placed so as to face a surface on an attachment side of the semiconductor device of the respective ball electrode, and
   wherein in (b), the burn-in test of the semiconductor device is performed in a state where each first projection part of each contact part is in contact with the respective ball electrode.

2. The semiconductor device manufacturing method according to claim 1,
   wherein the semiconductor device has a substrate to which the one or more ball electrodes are attached, and
   wherein each second projection part is arranged closer to the substrate than respective points of contact between the first projection parts and the respective ball electrode.

3. The semiconductor device manufacturing method according to claim 1,
   wherein a projection amount toward the respective ball electrode of the second projection part is smaller than a projection amount toward the respective ball electrode of at least one of the corresponding pair of first projection parts.

4. The semiconductor device manufacturing method according to claim 1,
   wherein in (b), at a start of the burn-in test, each second projection part is apart from the respective ball electrode.

5. The semiconductor device manufacturing method according to claim 1, wherein, in plan view, a shape of a tip of each second projection part follows a circular arc of the respective ball electrode.

6. The semiconductor device manufacturing method according to claim 1,
wherein the semiconductor device has a substrate to which the one or more ball electrodes are attached, and
wherein each second projection part is placed in a position at an end closest to the substrate of at least one of the pair of first projection parts.

7. The semiconductor device manufacturing method according to claim 1,
wherein said plurality of pin members is a pair of pin members, which are arranged so as to face each other, and
wherein in (b), the burn-in test of the semiconductor device is performed by sandwiching each ball electrode by the respective pair of first projection parts of the pin members.

8. The semiconductor device manufacturing method according to claim 7,
wherein the one or more ball electrodes is a plurality of ball electrodes arranged in a lattice shape, and
wherein the pair of pin members is opened/closed in a direction different from a direction of the lattice-shape arrangement of the plurality of ball electrodes.

9. The semiconductor device manufacturing method according to claim 1,
wherein at least one of the plurality of pin members includes another first projection part in addition to the pair of first projection parts,
wherein the another first projection part is arranged between the pair of first projection parts, and
wherein a projection amount of the another first projection part is smaller than respective projection amounts of the pair of first projection parts.

10. The semiconductor device manufacturing method according to claim 1,
wherein at least one of the plurality of pin members includes another pair of first projection parts in addition to said pair of first projection parts,
wherein the another pair of first projection parts is arranged between said pair of first projection parts, and
wherein respective projection amounts of the another pair of first projection parts are smaller than respective projection amounts of said pair of first projection parts.

11. A semiconductor device comprising:
a semiconductor chip;
a substrate having a first face over which the semiconductor chip is mounted and a second face positioned on a side opposite to the first face; and
a plurality of ball electrodes provided over the second face of the substrate,
wherein a pair of first impressions extending along a thickness direction of the substrate and a second impression extending along a direction crossing the thickness direction are formed in a surface of at least one of the plurality of ball electrodes, and
wherein the second impression is formed in the surface between the pair of first impressions, on a substrate side of the respective ball electrode.

12. The semiconductor device according to claim 11,
wherein a respective length along the thickness direction of each first impression is longer than a length along the thickness direction of the second impression.

13. The semiconductor device according to claim 11,
wherein a respective length along a width direction of each first impression is shorter than a length of the second impression along the width direction.

14. The semiconductor device according to claim 11,
wherein a plurality of impression groups, each made of two first impressions and one second impression, is formed in the surface of at least one of the plurality of ball electrodes.

15. The semiconductor device according to claim 11, wherein the pair of first impressions and the second impression are spaced apart and separate from each other in the surface of the respective ball electrode.

16. The semiconductor device according to claim 11, wherein each of the first and second impressions has an oval or elliptical shape.

* * * * *